US010174181B2

(12) United States Patent
Morozumi et al.

(10) Patent No.: US 10,174,181 B2
(45) Date of Patent: Jan. 8, 2019

(54) TRANSFER FILM, METHOD FOR MANUFACTURING FILM SENSOR, FILM SENSOR, FRONT PANEL AND SENSOR ASSEMBLY, AND IMAGE DISPLAY DEVICE

(71) Applicant: FUJIFILM Corporation, Tokyo (JP)

(72) Inventors: Kazumasa Morozumi, Fujinomiya (JP); Shuichiro Osada, Fujinomiya (JP); Ko Takeuchi, Fujinomiya (JP)

(73) Assignee: FUJIFILM Corporation, Minato-Ku, Tokyo (JP)

( * ) Notice: Subject to any disclaimer, the term of this patent is extended or adjusted under 35 U.S.C. 154(b) by 0 days.

(21) Appl. No.: 15/598,559

(22) Filed: May 18, 2017

(65) Prior Publication Data
US 2017/0253719 A1 Sep. 7, 2017

Related U.S. Application Data

(63) Continuation of application No. PCT/JP2015/082972, filed on Nov. 25, 2015.

(30) Foreign Application Priority Data

Dec. 3, 2014 (JP) ................. 2014-244876
Mar. 10, 2015 (JP) ................. 2015-046768

(51) Int. Cl.
C08K 3/22 (2006.01)
B41M 5/00 (2006.01)
C08K 3/04 (2006.01)
C08K 9/04 (2006.01)
G03F 7/031 (2006.01)
G03F 7/038 (2006.01)
G03F 7/20 (2006.01)
G03F 7/32 (2006.01)
G06F 3/044 (2006.01)
G06F 3/041 (2006.01)

(52) U.S. Cl.
CPC ................. C08K 3/22 (2013.01); B41M 5/00 (2013.01); C08K 3/04 (2013.01); C08K 9/04 (2013.01); G03F 7/031 (2013.01); G03F 7/038 (2013.01); G03F 7/20 (2013.01); G03F 7/327 (2013.01); G06F 3/044 (2013.01); G06F 3/0416 (2013.01); C08K 2003/2237 (2013.01); G06F 2203/04103 (2013.01)

(58) Field of Classification Search
CPC . B41M 1/28; B41M 1/34; B41M 5/00; B41M 5/0058; B41M 5/007; B41M 2205/04; G06F 2203/04103
USPC ............................................ 428/32.69, 32.73
See application file for complete search history.

(56) References Cited

U.S. PATENT DOCUMENTS

2015/0015813 A1    1/2015  Yoshinari et al.

FOREIGN PATENT DOCUMENTS

JP    2012-133597 A    7/2012
JP    2013-228695 A    11/2013

OTHER PUBLICATIONS

International Search Report for PCT/JP2015/082972 dated Feb. 16, 2016.

*Primary Examiner* — Bruce H Hess
(74) *Attorney, Agent, or Firm* — Sughrue Mion, PLLC

(57) ABSTRACT

A transfer film for forming a decorative layer on at least one surface of a film sensor has a coloring composition layer containing a black or white pigment, and the coloring composition layer satisfies inequality 1:

50>a×b>10    inequality 1 where a is the mass content ratio of the black or white pigment in the coloring composition layer, and b is the thickness of the coloring composition layer having a unit of μm.

19 Claims, 8 Drawing Sheets

TRANSFER FILM, METHOD FOR MANUFACTURING FILM SENSOR, FILM SENSOR, FRONT PANEL AND SENSOR ASSEMBLY, AND IMAGE DISPLAY DEVICE

CROSS-REFERENCE TO RELATED APPLICATIONS

This application is a Continuation of PCT International Application No. PCT/JP2015/082972 filed on Nov. 25, 2015, which claims priority under 35 U.S.C. § 119(a) to Japanese Patent Application No. 2014-244876 filed on Dec. 3, 2014 and Japanese Patent Application No. 2015-046768 filed on Mar. 10, 2015. Each of the above application(s) is hereby expressly incorporated by reference, in its entirety, into the present application.

BACKGROUND OF THE INVENTION

1. Field of the Invention

The present invention relates to transfer films, methods for manufacturing film sensors, film sensors, sensors integrated with front panel (front panel and sensor assemblies), and image display devices. Specifically, the invention relates to a front panel and sensor assembly serving as a capacitive input device that can detect a finger touch position as a change in capacitance, to a film sensor that can be used in such a sensor assembly, to a transfer film used for the manufacture of a film sensor, to a method for manufacturing a film sensor using such a transfer film, and to an image display device including a sensor integrated with front panel.

2. Description of the Related Art

Recently, there have been various types of electronic equipment, such as cellular phones, car navigation systems, personal computers, ticket machines, and banking terminals, in which a tablet-type input device is disposed on a surface of a display device such as a liquid crystal device. A user views an instruction image displayed in the image display region of the liquid crystal device and touches the position where the instruction image is displayed, for example, with a finger or touch pen, thereby inputting information associated with the instruction image. The liquid crystal display window of such electronic equipment is equipped with a cover glass for protection. Conventionally, this cover glass has a frame-shaped black light-shielding layer formed on the peripheral portion of the back surface of a transparent glass substrate.

Touch panels are often used in the electronic equipment mentioned above. Whereas resistive touch panels are currently predominant, there is a growing need for capacitive touch panels since they support multi-touch function, which allows an image to be zoomed in and out by gestures such as tapping, flicking, and pinching on the screen with finger tips, and also provide good visibility and durability. In particular, a need exists for capacitive touch panels including thinner sensors. There will therefore be a growing market for cover glass and sensor assemblies including a capacitive film sensor bonded to the back surface of a cover glass, such as that disclosed in Japanese Unexamined Patent Application Publication No. 2012-133597 (Patent Literature 1).

Patent Literature 1 discloses a cover glass and sensor assembly including a cover glass for an electronic equipment display window and a capacitive film sensor bonded to the back surface of the cover glass. The cover glass has a first frame-shaped light-shielding layer formed on the peripheral portion of the back surface of a transparent glass substrate by screen printing. The film sensor includes a transparent substrate sheet; a transparent conductive layer that is formed on each surface of the substrate sheet and that has an electrode pattern in a central window region and a fine routing circuit pattern in an outer frame region; a light-shielding conductive layer that is formed on the fine routing circuit pattern of each transparent conductive layer and that has the same width as the fine routing circuit pattern; an anticorrosive functional layer that is formed on each surface of the substrate sheet on which the transparent conductive layer and the light-shielding conductive layer are formed and that covers the portion of the outer frame region other than a terminal portion; and a second frame-shaped light-shielding layer formed on the peripheral portion of the front surface of the substrate sheet on which the transparent conductive layer, the light-shielding conductive layer, and the anticorrosive functional layer are formed. The second frame-shaped light-shielding layer is formed by exposing and developing a color resist material. The inner edges of the second frame-shaped light-shielding layer are located closer to the center than the inner edges of the first frame-shaped light-shielding layer. Patent Literature 1 discloses that this structure provides a cover glass and sensor assembly having a display screen with sharp contours, good visibility, and high visual integrity with the portion around the display screen as viewed through the cover glass.

Japanese Unexamined Patent Application Publication No. 2013-228695 (Patent Literature 2) discloses a black resin layer containing a black pigment, an alkali-soluble polymeric compound, an ethylenically-unsaturated-bond containing compound, and a photopolymerization initiator. The black resin layer has a bulk strength of 100 N/1.6 mm$\varphi$ (where $\varphi$ is the diameter) or more after heating at 240° C. for 80 minutes and then heating at 300° C. for 30 minutes.

Patent Literature 2 also discloses a method for manufacturing such a black resin layer. This method includes the steps of applying to a substrate a photosensitive resin composition containing a black pigment, an alkali-soluble polymeric compound, an ethylenically-unsaturated-bond containing compound, and a photopolymerization initiator; exposing the photosensitive resin composition on the substrate; developing the exposed photosensitive resin composition; and performing post-exposure after the development step. This method satisfies condition (A) or (B):

Condition (A): the photopolymerization initiator is an $\alpha$-aminoalkylphenone or $\alpha$-hydroxyalkylphenone.

Condition (B): the post-exposure after the development step is performed both on a surface of the photosensitive resin composition that is in contact with the substrate and on a surface of the photosensitive resin composition that is not in contact with the transparent substrate.

Patent Literature 2 also discloses a method for manufacturing a capacitive input device having a front panel and, on a noncontact side of the front panel, at least elements (1) to (4):

(1) a decorative member manufactured by the above method for manufacturing a black resin layer;

(2) a plurality of first transparent electrode patterns extending in a first direction, each composed of a plurality of pads connected through connections;

(3) a plurality of second electrode patterns electrically insulated from the first transparent electrode patterns and extending in a direction crossing the first direction, each composed of a plurality of pads; and (4) an insulating layer electrically insulating the first transparent electrode patterns from the second electrode patterns.

SUMMARY OF THE INVENTION

After conducting research on the cover glass and sensor assembly disclosed in Patent Literature 1, the inventors have found that, if the second frame-shaped light-shielding layer, which is formed by exposing and developing a color resist material, is provided on a film sensor simply using a color resist material, the color resist material would be insufficiently cured by photopolymerization because of insufficient sensitivity. Another problem is that the color resist material also cannot be cured by heat treatment. In the field of film sensors, electrodes and other elements are provided on a transparent substrate sheet; therefore, heat treatment is permitted only at lower temperatures (e.g., about 130° C. to 170° C.) during the manufacturing process than during the manufacture of color resists. In the field of color resist materials, a color resist material is typically cured by heating at about 230° C.

Patent Literature 2 discloses only a black resin layer for a decorative layer formed on a front panel; this literature discloses no decorative layer formed on a film sensor to be combined with a front panel. After conducting research on the method disclosed in Patent Literature 2, the inventors have found that it would be impossible to form a decorative layer on a film sensor by a method such as that disclosed in Patent Literature 2, in which an acrylic resin is polymerized by heating at 240° C. without an initiator, since heating is permitted only at lower temperatures, i.e., about 130° C. to 170° C.

An object of the present invention is to provide a transfer film with high optical density and high sensitivity for forming a decorative layer on at least one surface of a film sensor.

The inventors have found that a transfer film with high optical density and high sensitivity for forming a decorative layer on at least one surface of a film sensor can be provided by providing a coloring composition layer containing a black or white pigment in an amount within a particular range for a transfer film for forming a decorative layer on at least one surface of a film sensor.

The present invention and preferred embodiments thereof provide the following specific solutions to the problem discussed above.

A first aspect of the present invention provides a transfer film for forming a decorative layer on at least one surface of a film sensor. The transfer film has a coloring composition layer containing a black or white pigment. The coloring composition layer satisfies inequality 1:

$$50 > a \times b > 10 \qquad \text{inequality 1}$$

where a is the content (% by mass) of the black or white pigment in the coloring composition layer, and b is the thickness (μm) of the coloring composition layer.

The black or white pigment includes preferably carbon black or titanium oxide particles.

The carbon black is preferably a resin-coated carbon black.

The coloring composition layer preferably has a thickness of 0.5 to 10 μm.

The coloring composition layer preferably contains an oxime polymerization initiator.

The coloring composition layer preferably contains a thiol compound.

The thiol compound preferably has two or more thiol groups.

The coloring composition layer preferably contains a binder having a carboxyl group, and the binder preferably has an acid value of 50 mg KOH/2 or more.

The coloring composition layer preferably contains a polymerizable compound having at least five ethylenically unsaturated groups.

The coloring composition layer preferably has a halogen-containing compound content of 1% by mass or less.

The transfer film preferably further contains particles other than the black or white pigment. More preferably, the coloring composition layer contains particles other than the black or white pigment.

A second aspect of the present invention provides a method for manufacturing a film sensor. The method includes a step of transferring the coloring composition layer from the transfer film according to the first aspect to at least one surface of a film sensor to form a decorative layer. The film sensor includes a transparent substrate sheet, an electrode pattern disposed on each side of the substrate sheet, wiring lines connected to the electrode pattern, and an overcoat layer disposed over the electrode pattern.

The method for manufacturing a film sensor according to the second aspect preferably further includes a step of heating the film sensor at 130° C. to 170° C. after the step of transferring the coloring composition layer.

The at least one surface of the film sensor to which the coloring composition layer is transferred preferably includes at least a region of the wiring lines and at least a region of the overcoat layer.

A third aspect of the present invention provides a film sensor including a transparent substrate sheet, an electrode pattern disposed on each side of the substrate sheet, wiring lines connected to the electrode pattern, and an overcoat layer disposed over the electrode pattern. A decorative layer is disposed on at least one surface of the film sensor. The film sensor is manufactured by the method for manufacturing a film sensor according to the second aspect.

A fourth aspect of the present invention provides a sensor integrated with front panel having a transparent front panel and the film sensor according to the third aspect.

The sensor integrated with front panel according to the fourth aspect preferably further has a second decorative layer in a region of one surface of the front panel. The second decorative layer is preferably disposed between the front panel and the decorative layer of the film sensor. An orthogonal projection of the second decorative layer preferably overlaps at least a region of the decorative layer of the film sensor as viewed in a direction normal to the front panel.

The front panel is preferably formed of a glass.

A fifth aspect of the present invention provides an image display device including, the sensor integrated with front panel according to the fourth aspect.

The present invention provides a transfer film with high optical density and high sensitivity for forming a decorative layer on at least one surface of a film sensor.

DESCRIPTION OF THE PREFERRED EMBODIMENTS

A transfer film, a method for manufacturing a film sensor, a film sensor, a sensor integrated with front panel, and an image display device according to the present invention will now be described. Although various features may be described below based on typical embodiments and specific examples of the invention, these embodiments and examples are not intended to limit the scope of the invention. As used herein, any numerical range indicated by "to" is meant to include the values recited before and after "to" as the upper and lower limits thereof.

Transfer Film

A transfer film according to the present invention is a transfer film for forming a decorative layer on at least one surface of a film sensor. The transfer film has a coloring composition layer containing a black or white pigment. The coloring composition layer satisfies inequality 1:

$$50 > a \times b > 10 \qquad \text{inequality 1}$$

where a is the content (% by mass) of the black or white pigment in the coloring composition layer, and b is the thickness (μm) of the coloring composition layer.

The thus-configured transfer film according to the present invention, serving as a transfer film for forming a decorative layer on at least one surface of a film sensor, has high optical density and high sensitivity. To achieve a higher optical density, it is preferred that a×b, which is the product of the content (% by mass) of the black or white pigment in the coloring composition layer, a, and the thickness (μm) of the coloring composition layer, b, be greater than a particular lower limit, more preferably greater than 20, even more preferably greater than 30. To achieve a higher sensitivity, it is preferred that a×b, which is the product of the content (% by mass) of the black or white pigment in the transfer film, a, and the thickness (μm) of the transfer film, b, be smaller than a particular upper limit, more preferably smaller than 40.

A transfer film according to a preferred embodiment of the present invention will now be described.

Structure

Figure 13:
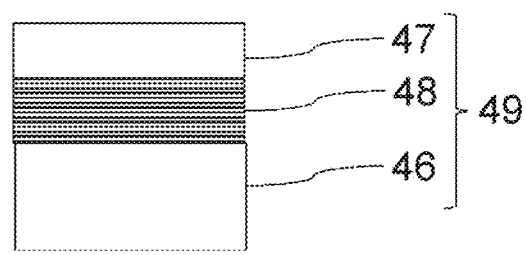
FIG. 13 is a schematic sectional view showing an example structure of a transfer according to the present invention.

FIG. 13 shows a preferred example structure of the transfer film according to the present invention. FIG. 13 is a schematic view of a transfer film 49 including, in sequence, a temporary support 46, a coloring composition layer 48, and a protective release layer (protective film) 47 that are stacked adjacent to each other.

Figure 11A:
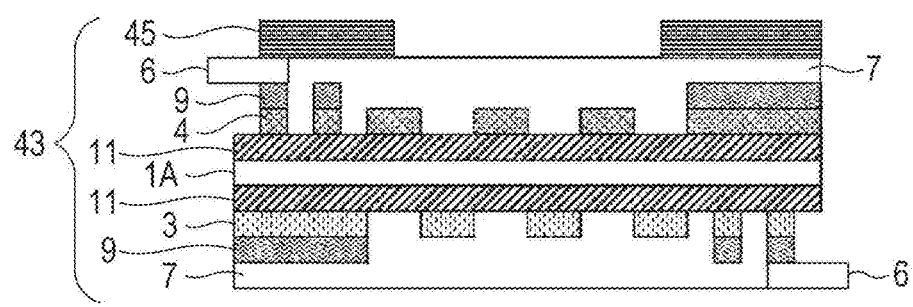
FIG. 11A is a schematic view of an example film sensor according to the present invention.
Figure 11B:
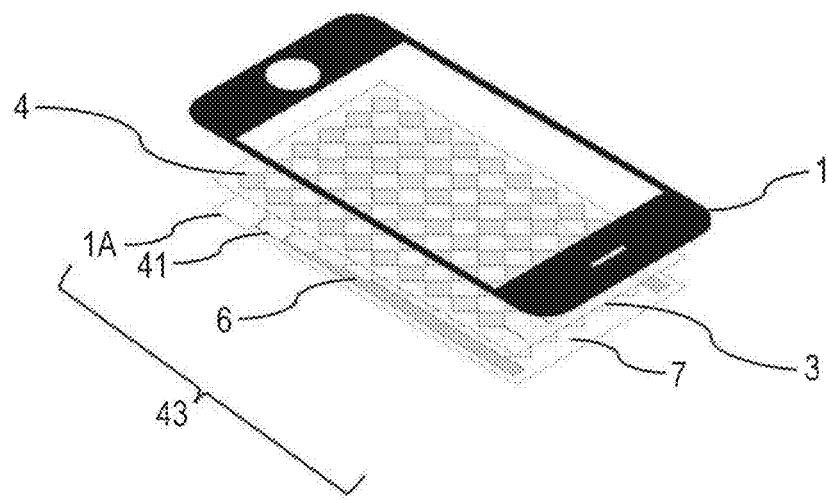
FIG. 11B is a schematic view of the example film sensor according to the present invention.

The transfer film according to the present invention is a transfer film for forming a decorative layer on at least one surface of a film sensor. FIGS. 11A and 11B show schematic views of an example film sensor according to the present invention that includes a decorative layer 45 formed by transferring the coloring composition layer 48 from the transfer film according to the present invention. The structure of the film sensor according to the present invention and the method for forming a decorative layer on at least one surface of a film sensor using the transfer film according to the present invention will be described later.

Coloring Composition Layer

The transfer film according to the present invention has a coloring composition layer containing a black or white pigment. The coloring composition layer satisfies inequality 1:

$$50 > a \times b > 10 \qquad \text{inequality 1}$$

where a is the content (% by mass) of the black or white pigment in the coloring composition layer, and b is the thickness (μm) of the coloring composition layer.

The coloring composition layer of the transfer film according to the present invention preferably has a halogen-containing compound content of 1% by mass or less, more preferably 0.2% by mass or less, to meet halogen-free requirements.

Black or White Pigment

The content of the black or white pigment in the coloring composition layer is calculated based on the total solid content, excluding solvents, of the coloring composition layer. As used herein, the term "total solid content" refers to the total mass of nonvolatile components, excluding components such as solvents, in the coloring composition layer.

The content of the black or white pigment in the coloring composition layer is preferably 3% to 25% by mass, more preferably 3% to 20% by mass, even more preferably 5% to 18% by mass, yet even more preferably 10% to 18% by mass, based on the total solid content, excluding solvents, of the coloring composition layer. A higher black or white pigment content is preferred to provide a thin transfer film with a higher optical density. A black or white pigment content of 25% by mass or less is preferred to achieve a higher sensitivity.

Any black pigment may be used without departing from the spirit of the present invention.

Examples of suitable black pigments that may be used in the present invention include known black pigments (e.g., organic pigments, inorganic pigments, and dyes).

For example, black pigments such as carbon black, titanium carbide, iron oxide, titanium oxide, and graphite may be used for reasons of optical density. In particular, carbon black is preferred.

A preferred carbon black that may be used in the transfer film according to the present invention is a resin-coated carbon black.

Although any white pigment may be used without departing from the spirit of the present invention, inorganic white pigments are preferred.

Examples of inorganic white pigments that may be used include those disclosed in paragraphs [0015] and [0114] of Japanese Unexamined Patent Application Publication No. 2005-7765.

Specific preferred inorganic white pigments include titanium oxide, zinc oxide, lithopone, light calcium carbonate, white carbon, aluminum oxide, aluminum hydroxide, and barium sulfate, more preferably titanium oxide and zinc oxide, even more preferably titanium oxide, yet even more preferably rutile- and anatase-type titanium oxides, still yet even more preferably rutile-type titanium oxide.

Titanium oxide may be surface-treated with silica, alumina, titanic, zirconia, an organic material, or any combination thereof.

This surface treatment reduces the catalytic activity of the titanium oxide and thus improves properties such as heat resistance and lightfastness.

To reduce the thickness (b) of the coloring composition layer after heating, the titanium oxide is preferably surface-treated with alumina or zirconia, more preferably a combination of alumina and zirconia.

The black or white pigment used in the transfer film according to the present invention is preferably carbon black or titanium oxide particles.

It is desirable to use the black pigment (preferably, carbon black) or white pigment in the form of a dispersion. The dispersion may be prepared by premixing the black or white pigment with a pigment dispersing agent and adding and dispersing the resulting composition in an organic solvent (or vehicle), described later. The term "vehicle" refers to the medium portion of a liquid coating in which a pigment is dispersed, including a liquid component (binder) that binds with the black or white pigment to form a layer and a component (organic solvent) that dissolves and dilutes the binder.

The black or white pigment may be dispersed with any disperser, including known dispersers such as kneaders, roller mills, attritors, supermills, dissolvers, homomixers, and sand mills, as disclosed in Kunizo Asakura, "Ganryo No Jiten (Encyclopedia of Pigments)", 1st edition, Asakura Publishing Co. Ltd., 2000, p. 438. The black or white pigment may also be pulverized by friction using a mechanical grinding technique disclosed in p. 310 of the same literature.

The black or white pigment preferably has a number average particle size of 0.001 to 0.1 μm, more preferably 0.01 to 0.08 μm, for reasons of dispersion stability. As used herein, the term "particle size" refers to the diameter of a circle having the same area as an electron micrograph of a particle. The term "number average particle size" refers to the average particle size of 100 randomly selected particles whose particle sizes have been determined.

The transfer film according to the present invention may be either a negative transfer film or a positive transfer film.

If the transfer film according to the present invention is a negative transfer film, the coloring composition layer preferably contains particles other than the black or white pigment, a polymerizable compound, a binder (preferably, an alkali-soluble resin), a polymerization initiator, a thiol, and a solvent. Other materials may also be used, including, but not limited to, additives.

The coloring composition layer of a transfer film for a second decorative layer (mask layer) provided on a front panel, described later, and the coloring composition layer of a transfer film for a color filter are finally heated at about 230° C. to 240° C. Unlike these coloring composition layers, the coloring composition layer of a transfer film for a film sensor is finally heated only at about 130° C. to 170° C. The coloring composition layer of a transfer film for a film sensor may therefore be insufficiently polymerized when heated. Thus, it is preferred that the coloring composition layer of a transfer film for a film sensor have a composition that allows it to be sufficiently polymerized by photopolymerization. This composition differs from the preferred compositions of the coloring composition layer of a transfer film for a second decorative layer provided on a front panel and the coloring composition layer of a transfer film for a color filter.

Other Particles

For reasons of transferability, it is preferred to add particles other than the black or white pigment to the coloring composition layer, provided that they do not interfere with the advantages of the present invention. If a pigment is used as the other particles, it is desirable that the pigment be homogeneously dispersed in the coloring composition layer. Accordingly, the pigment preferably has a particle size of 0.1 μm or less, more preferably 0.08 μm or less.

Examples of other particles include Victoria Pure Blue BO (Color Index (hereinafter C.I.) 42595), Auramine (C.I. 41000), Fat Black HB (C.I. 26150), Monolite Yellow GT (C.I. Pigment Yellow 12), Permanent Yellow GR (C.I. Pigment Yellow 17), Permanent Yellow HR (C.I. Pigment Yellow 83), Permanent Carmine FBB (C.I. Pigment Red 146), Hostaperm Red ESB (C.I. Pigment Violet 19), Permanent Ruby FBH (C.I. Pigment Red 11). Fastel Pink B supra (C.I. Pigment Red 81), Monastral Fast Blue (C.I. Pigment Blue 15), Monolite Fast Black B (C.I. Pigment Black 1), carbon, C.I. Pigment Red 97, C.I. Pigment Red 122, C.I. Pigment Red 149, C.I. Pigment Red 168, C.I. Pigment Red 177, C.I. Pigment Red 180, C.I. Pigment Red 192, C.I. Pigment Red 215, C.I. Pigment Green 7, CI. Pigment Blue 15:1, C.I. Pigment Blue 15:4, C.I. Pigment Blue 22, C.I. Pigment Blue 60, C.I. Pigment Blue 64, and C.I. Pigment Violet 23.

Preferred examples of other particles that may be added to the coloring composition layer include C.I. Pigment Red 177.

The content of the other particles is preferably 30% by mass or less, more preferably 3% to 20% by mass, even more preferably 5% to 15% by mass, based on the content of the black or white pigment.

Polymerizable Compound

The polymerizable compound used in the coloring composition layer is preferably a photopolymerizable compound. The photopolymerizable compound may have any photopolymerizable group, such as an ethylenically unsaturated group or an epoxy group. Preferably, the polymerizable compound used in the coloring composition layer is an ethylenically-unsaturated-bond containing compound, more preferably a compound having a (meth)acryloyl group.

Examples of ethylenically-unsaturated-bond containing compounds include polymerizable compounds disclosed in paragraphs [0023] and [0024] of Japanese Patent No. 4098550 and difunctional polymerizable compounds such as tricyclodecane dimethanol diacrylate.

Preferred examples of polymerizable compounds that may be used in the coloring composition layer include polymerizable compounds having at least five ethylenically unsaturated groups, such as dipentaerythritol hexaacrylate (DPHA), dipentaerythritol (penta/hexa)acrylate, and tripentaerythritol octaacrylate; urethane monomers such as urethane (meth)acrylate; and difunctional polymerizable compounds such as ethoxylated Bisphenol A diacrylate and tricyclodecane dimethanol diacrylate.

For reasons of sensitivity, the coloring composition layer of the transfer film according to the present invention preferably contains a polymerizable compound having at least five ethylenically unsaturated groups.

Although these photopolymerizable compounds may be used alone or in a combination of two or more, the use of a combination of two or more photopolymerizable compounds is preferred for reasons of sensitivity. Preferably, the polymerizable compound used in the coloring composition layer of the transfer film according to the present invention is a combination of a polymerizable compound having at least five ethylenically unsaturated groups and a difunctional polymerizable compound. The difunctional polymerizable compound is preferably used in an amount of 10% to 90% by mass, more preferably 20% to 85% by mass, even more preferably 30% to 80% by mass, of all polymerizable compounds. The polymerizable compound having at least five ethylenically unsaturated groups is preferably used in an amount of 10% to 90% by mass, more preferably 15% to 80% by mass, even more preferably 20% to 70% by mass, of all polymerizable compounds.

The polymerizable compound preferably has an average molecular weight of 200 to 3,000, more preferably 250 to 2,600, even more preferably 280 to 2,200.

The mass ratio of the polymerizable compound to the binder in the coloring composition layer (polymerizable compound content/binder content) is preferably 0.1 to 2 times, more preferably 0.2 to 1.5 times, even more preferably 0.3 to 1 time.

Binder

Any binder may be used in the coloring composition layer without departing from the spirit of the present invention. Any suitable binder may be selected from known binders, preferably alkali-soluble polymeric compounds.

Examples of alkali-soluble polymeric compounds that may be used include polymers disclosed in paragraph [0025] of Japanese Unexamined Patent Application Publication No. 2011-95716 and paragraphs [0033] to [0052] of Japanese Unexamined Patent Application Publication No. 2010-237589.

The coloring composition layer of the transfer film according to the present invention preferably contains a binder having a carboxyl group to achieve reduced edge roughness.

The binder used in the transfer film according to the present invention preferably has an acid value of 50 mg KOH/g or more, more preferably 60 mg KOH/g or more, even more preferably 65 mg KOH/g or more, to achieve reduced edge roughness.

Preferred examples of binders for use in the coloring composition layer include, but not limited to, benzyl methacrylate/methacrylic acid random copolymers and adducts of cyclohexyl methacrylate (a)/methyl methacrylate (b)/methacrylic acid (c) copolymers with glycidyl methacrylate, preferably adducts of cyclohexyl methacrylate (a)/methyl methacrylate (b)/methacrylic acid (c) copolymers with glycidyl methacrylate.

Polymerization Initiator

The polymerization initiator used in the coloring composition layer is preferably a photopolymerization initiator.

Examples of photopolymerization initiators that may be used include polymerization initiators disclosed in paragraphs [0031] to [0042] of Japanese Unexamined Patent Application Publication No. 2011-95716 and oxime polymerization initiators disclosed in paragraphs [0064] to [0081] of Japanese Unexamined Patent Application Publication No. 2015-014783. Preferred examples of photopolymerization initiators that may be used include 1,2-octanedione-1-[4-(phenylthio)-2-(O-benzoyloxime)] (the trade name IRGACURE OXE-01, BASF), ethan-1-one,[9-ethyl-6-(2-methylbenzoyl)-9H-carbazol-3-yl]-1-(O-acetyloxime) (the trade name IRGACURE OXE-02, BASF), 2-(dimethylamino)-2-[(4-methylphenyl)methyl]-1-[4-(4-morpholinyl)phenyl]-1-butanone (the trade name IRGACURE 379EG, BASF), 2-methyl-1-(4-methylthiophenyl)-2-morpholinopropan-1-one (the trade name IRGACURE; 907, BASF), 2-hydroxy-1-{4-[4-(2-hydroxy-2-methylpropionyl)benzyl]phenyl}-2-methylpropan-1-one (the trade name IRGACURE 127, BASF), 2-benzyl-2-dimethylamino-1-(4-morpholinophenyl)butanone-1 (the trade name IRGACURE 369, BASF), 2-hydroxy-2-methyl-1-phenylpropan-1-one (the trade name IRGACURE 1173, BASF), 1-hydroxycyclohexyl phenyl ketone (the trade name IRGACURE 184, BASF), 2,2-dimethoxy-1,2-diphenylethan-1-one (the trade name IRGACURE 651, BASF), an oxime ester polymerization initiator available under the trade name Lunar 6 (DKSH Japan K.K.), 2,4-diethylthioxanthone (KAYACURE DETX-S, Nippon Kayaku Co., Ltd.), and the fluorene oxime polymerization initiators DFI-091 and DFI-020 (Daito Chemix Corporation).

In particular, to achieve a higher sensitivity, it is preferred to use initiators other than halogen-containing polymerization initiators such as trichloromethyltriazines, which are used in applications such as color filter materials, more preferably α-aminoalkylphenones, α-hydroxyalkylphenones, and oxime polymerization initiators such as oxime esters. To achieve a higher sensitivity, the coloring composition layer of the transfer film according to the present invention preferably contains an oxime polymerization initiator.

The mass ratio of the polymerization initiator to the polymerizable compound in the coloring composition layer is preferably 0.05 to 0.125, more preferably 0.070 to 0.100, for reasons of taper angle and precipitation control.

Thiol Compound

The coloring composition layer of the transfer film according to the present invention preferably contains a thiol compound to achieve a higher sensitivity. The thiol compound may have one or more thiol groups (also called mercapto groups). To achieve a higher sensitivity, the thiol compound used in the transfer film according to the present invention preferably has two or more thiol groups, more preferably two to four thiol groups, even more preferably two or three thiol groups.

Examples of thiol compounds having one thiol group for use in the coloring composition layer include N-phenylmercaptobenzimidazole. Examples of thiol compounds having two or more thiol groups for use in the coloring composition layer include 1,4-bis(3-mercaptobutyryloxy)butane (KARENZ MT BD1, Showa Denko K.K.), 1,3,5-tris(3-mercaptobutyryloxyethyl)-1,3,5-triazine-2,4,6-(1H,3H,5H)-trione (KARENZ MT NR1, Showa Denko K.K.), pentaerythritol tetrakis(3-mercaptobutyrate) (KARENZ MT PE1, Showa Denko K.K.), and pentaerythritol tetrakis(3-mercaptopropionate) (PEMP, Sakai Chemical Industry Co., Ltd.).

Metal Oxidation Inhibitor

The coloring composition layer of the transfer film according to the present invention may optionally contain a metal oxidation inhibitor for surface treatment of metal wiring (including electrode patterns and wiring lines) in a region where an insulating layer or decorative layer has been removed to protect the metal wiring. The metal oxidation inhibitor used in the present invention is preferably a compound having a nitrogen-containing aromatic ring in its molecule.

The nitrogen-containing aromatic ring of the metal oxidation inhibitor used in the present invention is preferably at least one ring selected from the group consisting of imidazole, triazole, tetrazole, and thiadiazole rings and those fused with other aromatic rings, more preferably an imidazole ring or an imidazole ring fused with another aromatic ring.

Although the other aromatic ring may be either a homocycle or a heterocycle, it is preferably a homocycle, more preferably a benzene or naphthalene ring, even more preferably a benzene ring.

Preferred examples of metal oxidation inhibitors include imidazole, benzimidazole, tetrazole, mercaptothiadiazole, and benzotriazole, more preferably imidazole, benzimidazole, and benzotriazole.

The content of the metal oxidation inhibitor is preferably 0.1% to 20% by mass, more preferably 0.5% to 10% by mass, even more preferably 1% to 5% by mass, of the total mass of the coloring composition layer used in the present invention.

Additives

Additives may be used in the coloring composition layer. Examples of additives include surfactants disclosed in paragraph [0017] of Japanese Patent No. 4502784 and paragraphs [0060] to [0071] of Japanese Unexamined Patent Application Publication No. 2009-237362; thermal polymerization inhibitors (also called polymerization inhibitors, preferably phenothiazine) disclosed in paragraph [0018] of Japanese Patent No. 4502784; and other additives disclosed in paragraphs [0058] to [0071] of Japanese Unexamined Patent Application Publication No. 2000-310706.

Solvent

The coloring composition layer preferably further contains a solvent.

Examples of solvents that may be present when the coloring composition layer is manufactured by coating include the following solvents.

Any commonly used solvent may be used. Specific examples of solvents include esters, ethers, ketones, and aromatic hydrocarbons.

Solvents disclosed in paragraphs [0054] and [0055] of US2005/282073A1 are also suitable for use in the present invention, including methyl ethyl ketone, propylene glycol monomethyl ether, propylene glycol monomethyl ether acetate, cyclohexanone, cyclohexanol, methyl isobutyl ketone, ethyl lactate, and methyl lactate.

Among these solvents, preferred solvents for use in the present invention include 1-methoxy-2-propyl acetate, methyl 3-ethoxypropionate, ethyl 3-ethoxypropionate, ethyl cellosolve acetate, ethyl lactate, butyl acetate, methyl 3-methoxypropionate, 2-heptanone, cyclohexanone, diethylene glycol monoethyl ether acetate (ethyl carbitol acetate), diethylene glycol monobutyl ether acetate (butyl carbitol acetate), propylene glycol methyl ether acetate, and methyl ethyl ketone. These solvents may be used alone or in a combination of two or more.

Optionally, organic solvents having boiling points of 180° C. to 250° C. (high-boiling-point solvents) may also be used. Examples of high-boiling-point solvents include diethylene glycol monobutyl ether, diethylene glycol monoethyl ether acetate, diethylene glycol monoethyl ether, 3,5,5-trimethyl-2-cyclohexen-1-one, dipropylene glycol monomethyl ether acetate, propylene glycol diacetate, propylene glycol n-propyl ether acetate, diethylene glycol diethyl ether, 2-ethyl-hexyl acetate, 3-methoxy-3-methylbutyl acetate, γ-butyrolactone, tripropylene glycol methyl ethyl acetate, dipropylene glycol n-butyl acetate, propylene glycol phenyl ether acetate, and 1,3-butanediol diacetate.

The coloring composition layer preferably contains a first solvent having an evaporation rate of 200% or more of that of butyl acetate and a second solvent having an evaporation rate of 50% or less of that of butyl acetate. As such solvents, the coloring composition layer preferably contains a polyhydric alcohol derivative and a ketone.

Thickness

The coloring composition layer of the transfer film according to the present invention preferably has a thickness of 0.5 to 10 μm, more preferably 1.0 to 8.0 μm, even more preferably 1.5 to 5.0 μm, for reasons of design after bonding to a front panel.

Temporary Support

The transfer film according to the present invention preferably has a temporary support.

The temporary support may be formed of a flexible material.

Examples of such temporary supports include cycloolefin copolymer films, polyethylene terephthalate (hereinafter also referred to as "PEI") films, triacetylcellulose films, polystyrene films, and polycarbonate films. In particular, PET films are preferred for ease of handling.

The temporary support may be transparent or may contain materials such as silicon dye, alumina sol, chromium salts, and zirconium salts.

The temporary support may be made conductive by a technique such as that disclosed in Japanese Unexamined Patent Application Publication No. 2005-221726.

Other Layers

The transfer film according to the present invention may further include, between the temporary support and the coloring composition layer, a thermoplastic resin layer as disclosed in paragraph [0026] of Japanese Patent No. 4502784 and an interlayer as disclosed in paragraph [00271] of Japanese Patent No. 4502784.

The transfer film according to the present invention preferably further includes, for example, a protective film (hereinafter also referred to as "protective release layer") on the surface of the coloring composition layer. Examples of suitable protective films that may be used include those disclosed in paragraphs [0083] to [0087] and [0093] of Japanese Unexamined Patent Application Publication No. 2006-259138.

Method for Manufacturing Transfer Film

The transfer film according to the present invention may be fabricated by a method for fabricating a curable transfer material disclosed in paragraphs [0094] to [0098] of Japanese Unexamined Patent Application Publication No. 2006-259138. Preferably, the transfer film according to the present invention is manufactured by the following method for manufacturing a transfer film.

The method for manufacturing a transfer film preferably includes a step of forming a coloring composition layer on a temporary support.

The method for manufacturing a transfer film preferably further includes a step of forming a thermoplastic resin layer before forming the coloring composition layer on the temporary support.

The method for manufacturing a transfer film preferably includes a step of forming an interlayer which is between the thermoplastic resin layer and the coloring composition layer after the step of forming the thermoplastic resin layer. A specific preferred method for fabricating a transfer film having an interlayer includes forming a thermoplastic resin layer on a temporary support by applying and drying a solution in which a thermoplastic organic polymer and additives are dissolved (thermoplastic resin layer coating solution); forming an interlayer on the thermoplastic resin layer by applying and drying a preparation prepared by adding a resin and additives to a solvent that does not dissolve the thermoplastic resin layer (interlayer coating solution); and forming a coloring composition layer on the interlayer by applying and drying a coloring composition layer coating solution prepared using a solvent that does not dissolve the interlayer.

Film Sensor

A film sensor according to the present invention includes a transparent substrate sheet, an electrode pattern disposed on each side of the substrate sheet, wiring lines connected to the electrode pattern, and an overcoat layer disposed over the electrode pattern. A decorative layer is disposed on at least one surface of the film sensor. The film sensor is manufactured by a method for manufacturing a film sensor according to the present invention.

Structure of Film Sensor

FIG. 11A shows a schematic view of an example film sensor according to the present invention.

The film sensor according to the present invention having the structure shown in FIG. 11A includes a substrate sheet 1A and a transparent layer 11 disposed on each surface of the substrate sheet 1A.

The film sensor according to the present invention having the structure shown in FIG. 11A includes an electrode pattern 4, a light-shielding conductive layer 9, an overcoat layer 7, wiring lines 6, and a decorative layer 45 on the side of the substrate sheet 1A on which a front panel, described later, is to be stacked.

The film sensor according to the present invention having the structure shown in FIG. 11A includes an electrode pattern 3, a light-shielding conductive layer 9, an overcoat layer 7, and wiring lines 6 on the side of the substrate sheet 1A opposite the side on which the front panel, described later, is to be stacked.

The film sensor has a decorative layer 45 (decorative layer of the film sensor) formed by transferring the coloring composition layer from the transfer film according to the present invention.

The use of the transfer film according to the present invention allows the coloring composition layer of the transfer film according to the present invention to be laminated across the boundary between the wiring lines 6, which require a certain thickness, and the overcoat layer 7 without leaving bubbles at the boundary of the mask portion through a simple process requiring no expensive equipment such as a vacuum laminator.

The decorative layer is preferably a frame-shaped decorative layer. Specifically, if the film sensor according to the present invention is used in an image display device including, a sensor integrated with front panel according to the present invention, described later, the decorative layer is preferably frame-shaped around the central image display portion (electronic equipment display window). A preferred example of the decorative layer of the film sensor according to the present invention is one similar to a frame-shaped light-shielding layer disclosed in Japanese Patent No. 5026580.

The preferred range of thickness of the decorative layer 45 of the film sensor is similar to that of the coloring composition layer of the transfer film according to the present invention.

Figure 3:
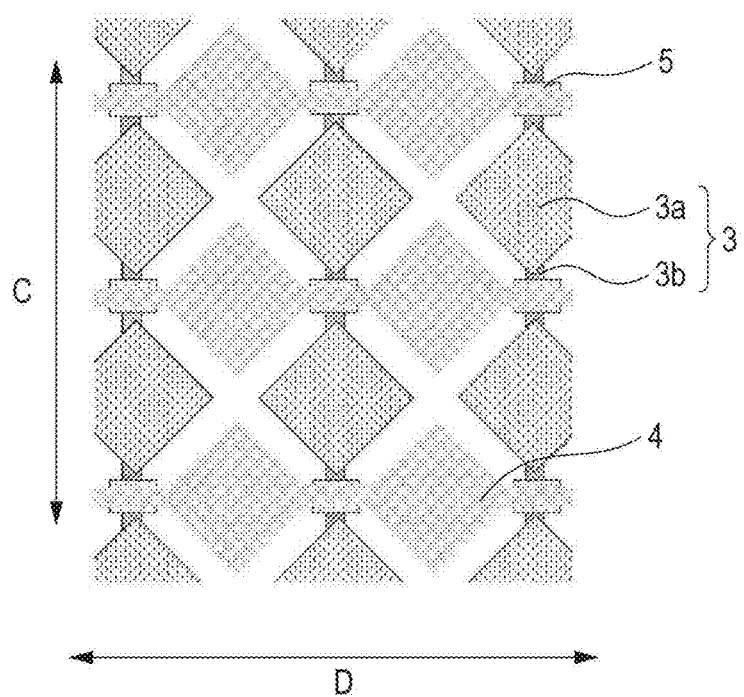
FIG. 3 is an illustration showing example of electrode patterns in the present invention.

If the film sensor according to the present invention is used in a sensor integrated with front panel, described later, the electrode patterns may be provided as first and second electrode patterns in two substantially orthogonal directions, i.e., row and column directions (see, for example, FIG. 3). For example, in the structure in FIG. 3, the electrode patterns may be first and second electrode patterns 3 and 4.

The first and second electrode patterns 3 and 4 will now be described with reference to FIG. 3. FIG. 3 is an illustration showing example first and second electrode patterns. As shown in FIG. 3, the first electrode pattern 3 is composed of pads 3a arranged in a first direction C with connections 3b therebetween. The second electrode pattern 4 is electrically insulated from the first electrode pattern 3 by an insulating layer 5 and is composed of pads arranged in a direction (second direction D in FIG. 3) crossing the first direction. When the first electrode pattern 3 is formed, the pads 3a and the connections 3b may be formed together. Alternatively, the connections 3b may be formed alone, and the pads 3a and the second electrode pattern 4 may be formed (patterned) together. If the pads 3a and the second electrode pattern 4 are formed (patterned) together, as shown in FIG. 3, the individual layers are formed such that portions of the connections 3b are connected to portions of the pads 3a and that the first and second electrode patterns 3 and 4 are electrically insulated from each other by the insulating layer 5. Although the insulating layer 5 is depicted as a discontinuous layer in FIG. 3 for illustration purposes, the substrate sheet 1A may be used as the insulating layer 5 in the film sensor according to the present invention.

The film sensor according to the present invention preferably includes a non-pattern region where no electrode pattern is formed. As used herein, the term "non-pattern region" refers to a region where no electrode pattern is formed.

The substrate sheet 1A and the transparent layers 11 are preferably adjacent to each other.

In the example shown in FIG. 11A, the transparent layers 11 are disposed adjacent to the substrate sheet 1A.

A third transparent layer may be disposed between the substrate sheet 1A and each transparent layer 11 without departing from the spirit of the present invention. For example, the film sensor may have a third transparent layer (not shown in FIG. 11A) with a refractive index of 1.5 to 1.52 between the substrate sheet 1A and each transparent layer 11.

The transparent layers and the electrode patterns of the film sensor are preferably adjacent to each other.

Although the electrode pattern 4 may have an end of any shape, it may have a tapered end. An example tapered end of an electrode pattern is the end of the electrode pattern shown in FIG. 10.

If the electrode pattern has a tapered end, the angle of the end of the electrode pattern (hereinafter also referred to as "taper angle") is preferably 30° or less, more preferably 0.1° to 15°, even more preferably 0.5° to 5°.

The taper angle as used herein may be determined by capturing a micrograph of an end of an electrode pattern and directly measuring the taper angle of a triangle approximating the tapered portion in the micrograph.

Figure 10:
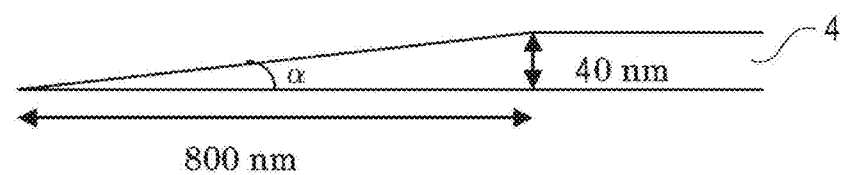
FIG. 10 is an illustration showing an example tapered end of an electrode pattern.

The triangle approximating the tapered portion in FIG. 10 has a lower base of 800 nm and a height (thickness from the lower base to an upper base substantially parallel thereto) of 40 nm. The taper angle α is about 3°. The triangle approximating the tapered portion preferably has a lower base of 10 to 3,000 nm, more preferably 100 to 1,500 nm, even more preferably 300 to 1,000 nm.

The preferred range of height of the triangle approximating the tapered portion is similar to the preferred range of thickness of the electrode pattern.

The wiring lines 6 are electrically connected to at least one of the first and second electrode patterns 3 and 4. Preferably, the wiring lines 6 are elements different from the first and second electrode patterns 3 and 4.

In the illustration shown in FIG. 11A, the wiring lines 6 are connected to the second electrode pattern 4 via the light-shielding conductive layer 9. The wiring lines are preferably frame-shaped. Specifically, if the film sensor according to the present invention is used in an image display device including, a sensor integrated with front panel according to the present invention, described later, the wiring lines are preferably frame-shaped around the central image display portion.

The electrode patterns and the light-shielding conductive layers of the film sensor are preferably adjacent to each other.

The light-shielding conductive layers are preferably frame-shaped. Specifically, if the film sensor according to the present invention is used in an image display device including, a sensor integrated with front panel according to the present invention, described later, the light-shielding conductive layers are preferably frame-shaped around the central image display portion.

In FIG. 11A, the overcoat layers 7 are formed over all elements other than the wiring lines. Alternatively, the overcoat layers 7 may be formed over only some of the elements.

The transparent layers and the overcoat layers of the film sensor are preferably continuously formed over the electrode patterns and the non-pattern regions where no electrode pattern is formed, either directly or with another layer therebetween.

As used herein, the term "continuously" means that the transparent layers and the overcoat layers are continuous layers, rather than patterned layers. That is, the transparent layers and the overcoat layers preferably have no opening so that the electrode patterns are less visible.

The transparent layers and the overcoat layers are preferably directly formed over the electrode patterns and the non-pattern regions, rather than with another layer therebetween. If these layers are formed over the electrode patterns and the non-pattern regions with another layer therebetween, the other layer may be, for example, a light-shielding conductive layer if the film sensor includes a light-shielding conductive layer.

Materials for Film Sensor

The materials for the film sensor will now be described.

Decorative Layer

The decorative layer 45, which is formed by transferring the coloring composition layer from the transfer film according to the present invention, is formed of the same material as the coloring composition layer of the transfer film according to the present invention.

Substrate Sheet

It is preferred to use a substrate sheet having no optical strain and high transparency. Specific examples of such materials include polyethylene terephthalate (PET), polyethylene naphthalate, polycarbonate (PC), triacetylcellulose (TAC), and cycloolefin polymer (COP).

Transparent Layers

The transparent layers preferably have a refractive index of 1.6 to 1.78 and a thickness of 55 to 110 nm to improve the invisibility of the electrode patterns.

The transparent layers preferably have a refractive index of 1.6 to 1.78, more preferably 1.65 to 1.74. The transparent layers may have a single-layer structure or a multilayer structure including two or more layers. The refractive index of a transparent layer having a multilayer structure including two or more layers refers to the total refractive index of these layers.

The transparent layers may be formed of any material having a refractive index within such a range.

The transparent layers preferably have a thickness of 55 to 110 preferably 60 to 100 nm, even more preferably 70 to 90 nm.

The thickness of a transparent layer having a multilayer structure including two or more layers refers to the total thickness of all layers.

Electrode Patterns

The film sensor according to the present invention has an electrode pattern on each side of the substrate sheet.

The first electrode pattern of the film sensor according to the present invention may be either a transparent electrode pattern or a nontransparent electrode pattern, preferably a transparent electrode pattern.

The second electrode pattern of the film sensor according to the present invention may be either a transparent electrode pattern or a nontransparent electrode pattern, preferably a transparent electrode pattern.

The electrode patterns preferably have a refractive index of 1.75 to 2.1.

The electrode patterns may be formed of any material, including known materials. For example, the electrode patterns may be formed of an optically transparent conductive metal layer such as an indium tin oxide (ITO) or indium zinc oxide (IZO) layer. Examples of materials that may be used for the electrode patterns include ITO layers; metal layers such as Al, Zn, Cu, Fe, Ni, Cr, and Mo layers; and metal oxide layers such as $SiO_2$ layers. These elements may have a thickness of 10 to 200 nm. An amorphous ITO layer can also be transformed into a polycrystalline ITO layer by firing to achieve reduced electrical resistance. Alternatively, the first electrode pattern 3, the second electrode pattern 4, and the wiring lines 6, described later, may be manufactured using a photosensitive film having a photocurable resin layer containing conductive fibers. As another example, if ITO is used to form elements such as the first electrode pattern, reference may be made to, for example, paragraphs [0014] to [0016] of Japanese Patent No. 4506785. In particular, the electrode patterns are preferably formed of an ITO layer.

Wiring Lines

The film sensor according to the present invention has wiring lines. The wiring lines are preferably wiring lines for the electrode patterns and are conductive elements different from the electrode patterns. The wiring lines may be the same conductive elements as the light-shielding conductive layers, described later, or may be different conductive elements from the light-shielding conductive layers, described later.

The wiring lines may be formed of any material, including known materials. Whereas a Mo/Al/Mo three-layer structure (MAM) has been commonly used as a material for wiring lines because of its high conductivity and ease of microfabrication, it is preferred to use the same materials as mentioned above for the electrode patterns. Other metals may also be used, including gold (Au), silver (Ag), copper (Cu), aluminum (Al), molybdenum (Mo), palladium (Pd), platinum (Pt), carbon (C), and iron (Fe). Conductive pastes and inks containing these metals can be deposited by a wet process to form the wiring lines at a lower cost than vapor deposition. The wiring lines are preferably formed of a metal, more preferably copper or aluminum.

Light-Shielding Conductive Layers

The light-shielding conductive layers 9 may be formed of, for example, a metal with high conductivity and good light-shielding performance or an alloy or compound thereof. The light-shielding conductive layers 9 may be formed by processes such as vacuum vapor deposition, sputtering, ion plating, and metal plating. The light-shielding conductive layers 9 are preferably formed of a material that can be etched with an etchant that does not etch the electrode patterns. Specifically, the light-shielding conductive layers 9 are preferably formed of a material selected from materials that can be etched with an etchant that does not etch the electrode patterns. Preferred examples of such metals include aluminum, nickel, copper, silver, and tin. Copper foils having thicknesses of 20 to 1,000 nm are particularly preferred since such metal layers provide good conductivity and light-shielding performance and can be easily etched with aqueous hydrogen peroxide in an acidic condition in which the electrode patterns are not etched. More preferably, the light-shielding conductive layers 9 have a thickness of 30 nm or more, even more preferably 100 to 500 nm. Light-shielding conductive layers 9 having a thickness of 100 nm or more provide high conductivity, whereas light-shielding conductive layers 9 having a thickness of 500 nm or less are easy to handle and have good workability.

Overcoat Layers

The overcoat layers of the film sensor are preferably formed on the electrode patterns by transfer.

The flexible wiring formed on the film sensor, including the electrode patterns and the wiring lines, can be directly connected to terminal portions (not shown) for the wiring lines so that signals can be transmitted from the film sensor to an electrical circuit.

The overcoat layers may be formed from a photocurable resin or a thermosetting and photocurable resin. In particular, a thermosetting and photocurable transparent resin layer is preferred since it can be easily formed by photocuring after transfer and can then be thermally cured to achieve a higher layer reliability.

The overcoat layers preferably have a thickness of 5 μm or more. To provide sufficient surface protection capability, the overcoat layers more preferably have a thickness of 5 to 16 μm, even more preferably 5 to 13 μm, yet even more preferably 5 to 10 μm.

The overcoat layers preferably have a melt viscosity ηc as measured at 100° C. of $1.0 \times 10^3$ Pa·s or more, more preferably $1.0 \times 10^3$ to $1.0 \times 10^6$ Pa·s, even more preferably $3.0 \times 10^3$ to $1.0 \times 10^6$ Pa·s, yet even more preferably $4.0 \times 10^3$ to $1.0 \times 10^5$ Pa·s.

The overcoat layers preferably have a refractive index of 1.50 to 1.53, more preferably 1.50 to 1.52, even more preferably 1.51 to 1.52.

The overcoat layers preferably contain a binder polymer, a polymerizable compound, and a polymerization initiator.

The overcoat layers are preferably transparent resin layers. The refractive index of the overcoat layers may be controlled in any manner, including the use of overcoat layers having the desired refractive index alone, the use of overcoat layers containing particles such as metal or metal oxide particles, and the use of a composite of a metal salt and a polymer.

The overcoat layers may further contain additives. Examples of such additives include surfactants disclosed in paragraph [0017] of Japanese Patent No. 4502784 and paragraphs [0060] to [0071] of Japanese Unexamined Patent Application Publication No. 2009-237362; thermal polymerization inhibitors disclosed in paragraph [0018] of Japanese Patent No. 4502784; and other additives disclosed in paragraphs [0058] to [0071] of Japanese Unexamined Patent Application Publication No. 2000-310706.

Binder Polymer

The binder polymer that is preferably present in the overcoat layers may be any polymer component. Preferred binder polymers include those with high surface hardness and heat resistance, more preferably alkali-soluble resins. Preferred examples of alkali-soluble resins include known curable siloxane resin materials and acrylic resin materials. The binder polymer present in the organic-solvent-based resin composition used to form the overcoat layers preferably contains an acrylic resin. Specific preferred examples of binder polymers for the overcoat layers are illustrated below.

Any resin (binder, also called "polymer") that is soluble in an organic solvent may be used in the overcoat layers without departing from the spirit of the present invention. Any suitable resin may be selected from known resins, preferably alkali-soluble resins. Examples of alkali-soluble resins that may be used include polymers disclosed in paragraph [0025] of Japanese Unexamined Patent Application Publication No. 2011-95716 and paragraphs [0033] to [0052] of Japanese Unexamined Patent Application Publication No. 2010-237589.

The overcoat layers may contain a polymer latex. As used herein, the term "polymer latex" refers to a dispersion of water-insoluble polymer particles in water. Polymer latexes are disclosed in, for example, Soichi Muroi, "Kobunshi Ratekkusu No Kagaku (Chemistry of Polymer Latexes)" (published by Kobunshi Kanko-Kai, 1973).

Preferred examples of polymer particles that may be used include those of polymers such as acrylic polymers, vinyl acetate polymers, rubbers (e.g., styrene-butadiene and chloroprene rubbers), olefinic polymers, polyesters, polyurethanes, polystyrenes, and copolymers thereof.

It is preferred to strengthen the binding force between the polymer chains forming the polymer particles. Examples of techniques for strengthening the binding force between the polymer chains include the use of hydrogen bonding interaction and the formation of covalent bonds. A preferred technique for inducing hydrogen bonding force is to introduce a monomer having a polar group into the polymer chains through copolymerization or graft polymerization. Examples of polar groups include carboxyl groups (such as those present in acrylic acid, methacrylic acid, itaconic acid, fumaric acid, maleic acid, crotonic acid, and partially esterified maleic acid); primary, secondary, and tertiary amino groups; ammonium salt groups; and sulfonic acid groups styrenesulfonic acid), preferably carboxyl and sulfonic acid groups.

The proportion of the monomer having a polar group in the copolymer is preferably 5% to 35% by mass, more preferably 5% to 20% by mass, even more preferably 15% to 20% by mass, per 100% by mass of the polymer. Examples of techniques for forming covalent bonds include reacting functional groups such as hydroxyl, carboxyl, primary amino, secondary amino, acetoacetyl, and sulfonic acid groups with compounds such as epoxy compounds, blocked isocyanates, isocyanates, vinyl sulfone compounds, aldehyde compounds, methylol compounds, and carboxylic anhydrides.

Preferred polymers obtained by such reactions include polyurethanes, which are obtained by the reaction of polyols with poly isocyanates, more preferably in combination with polyamines, serving as chain extenders, even more preferably polyurethane ionomers having the polar groups mentioned above in the polymer chain.

The polymer preferably has a mass average molecular weight of 10,000 or more, more preferably 20,000 to 100,000. Examples of polymers suitable for use in the present invention include ethylene ionomers, i.e., copolymers of ethylene with methacrylic acid, and polyurethane ionomers.

Polymer latexes that may be used in the present invention include those obtained by emulsion polymerization and those obtained by emulsion. Such methods for preparing polymer latexes are disclosed in, for example, "Emulsion Latex Handbook" (edited by the Committee on Editing Emulsion Latex Handbook, published by Taiseisha Ltd. (1975)).

Examples of polymer latexes that may be used in the present invention include aqueous dispersions of polyethylene ionomers (the trade names CHEMIPEARL S120 (Mitsui Chemicals, Inc., solid content=27%), CHEMIPEARL S100 (Mitsui Chemicals, Inc., solid content=27%), CHEMIPEARL S111 (Mitsui Chemicals, Inc., solid content=27%), CHEMIPEARL S200 (Mitsui Chemicals, Inc., solid content=27%), CHEMIPEARL S300 (Mitsui Chemicals, Inc., solid content=35%), CHEMIPEARL S650 (Mitsui Chemicals, Inc., solid content=27%), and CHEMIPEARL S75N (Mitsui Chemicals, Inc., solid content=24%)); aqueous dispersions of polyether polyurethanes (the trade names HYDRAN WLS-201 (DIC Corporation, solid content=35%, Tg=−50° C.), HYDRAN WLS-202 (DIC Corporation, solid content=35%, Tg=−50° C.), HYDRAN WLS-221 (DIC Corporation, solid content=35%, Tg=−30° C.), HYDRAN WLS-210 (DIC Corporation, solid content=35%, Tg=−15° C.), HYDRAN WLS-213 (DIC Corporation, solid content=35%, Tg=−15° C.), HYDRAN WLI-602 (DIC Corporation, solid content=39.5%, Tg=−50° C.), and HYDRAN WLI-611 (DIC Corporation, solid content=39.5%, Tg=−15° C.)); an alkyl acrylate copolymer ammonium (the trade name JURYMER AT-210, Nihon junyaku Co., Ltd.); an alkyl acrylate copolymer ammonium (the trade name JURYMER. ET-410, Nihon Junyaku Co., Ltd.); an alkyl acrylate copolymer ammonium (the trade name JURYMER AT-510, Nihon Junyaku Co., Ltd.); and an emulsion of polycyclic acid (the trade name JURYMER AC-10L, Nihon Junyaku Co., Ltd.) prepared by neutralization with ammonia.

Polymerizable Compound

The overcoat layers preferably contain a polymerizable compound. The polymerizable compound may be either a photopolymerizable compound or a thermally polymerizable compound.

The overcoat layers preferably have a photopolymerizable compound. The photopolymerizable compound may have any photopolymerizable group, such as an ethylenically unsaturated group or an epoxy group. Preferably, the overcoat layers contain a photopolymerizable compound having an ethylenically unsaturated group, more preferably a compound having a (meth)acryloyl group.

Such photopolymerizable compounds may be used alone or in a combination of two or more. The use of a combination of two or more photopolymerizable compounds is preferred to improve the moisture and heat resistance, after the application of saline water, of the overcoat layers after transfer and exposure. The use of a combination of a photopolymerizable compound having three or more functional groups and a photopolymerizable compound having two functional groups is preferred to improve the moisture and heat resistance, after the application of saline water, of the overcoat layers after transfer and exposure. The photopolymerizable compound having two functional groups is preferably used in an amount of 10% to 90% by mass, more preferably 20% to 85% by mass, even more preferably 30% to 80% by mass, of all photopolymerizable compounds. The photopolymerizable compound having three or more functional groups is preferably used in an amount of 10% to 90% by mass, more preferably 15% to 80% by mass, even more preferably 20% to 70% by mass, of all photopolymerizable compounds. The photopolymerizable compounds preferably include at least a compound having two ethylenically unsaturated groups and a compound having at least three ethylenically unsaturated groups, more preferably a compound having two (meth)acryloyl groups and a compound having at least three (meth)acryloyl groups.

The photopolymerizable compounds preferably include an urethane (meth)acrylate. The amount of urethane (meth)acrylate mixed is preferably 10% by mass or more, more preferably 20% by mass or more, of all photopolymerizable compounds. The urethane (meth)acrylate preferably has three or more photopolymerizable groups (i.e., (meth)acryloyl groups), more preferably four or more photopolymerizable groups.

The photopolymerizable compound having two ethylenically unsaturated groups may be any compound having two ethylenically unsaturated groups in the molecule, including commercially available (meth)acrylates. Preferred examples of such compounds that may be used include tricyclodecane dimethanol diacrylate (A-DCP, Shin Nakamura Chemical Co., Ltd.), tricyclodecane dimethanol dimethacrylate (DCP, Shin Nakamura Chemical Co., Ltd.), 1,9-nonanediol diacrylate (A-NOD-N, Shin Nakamura Chemical Co., Ltd.), and 1,6-hexanediol diacrylate (A-HD-N, Shin Nakamura Chemical Co., Ltd.).

The photopolymerizable compound having three or more ethylenically unsaturated groups may be any compound having three or more ethylenically unsaturated groups in the molecule, including (meth)acrylates having backbones such as dipentaerythritol (tri/tetra/penta/hexa)acrylate, pentaerythritol (tri/tetra)acrylate, trimethylolpropane triacrylate, ditrimethylolpropane tetraacrylate, and isocyanurate acrylate, preferably those having a longer span between the (meth)acrylate moieties. Specific preferred examples of such compounds that may be used include caprolactone-modified derivatives (e.g., KAYARAD DPCA from Nippon Kayaku Co., Ltd. and A-9300-1CL from Shin Nakamura Chemical Co., Ltd.) and alkylene oxide-modified derivatives e.g., KAYARAD RP-1040 from Nippon Kayaku Co., Ltd., ATM-35E and A-9300 from Shin Nakamura Chemical Co., Ltd., and EBECRYL 135 from Daicel-Allnex Ltd.) of (meth)acrylates having backbones such as dipentaerythritol (tri/tetra/penta/hexa)acrylate, pentaerythritol (tri/tetra)acrylate, trimethylolpropane triacrylate, ditrimethylolpropane tetraacrylate, and isocyanurate acrylate. Carboxyl-containing polybasic acid-modified (meth)acrylate monomers (e.g., ARONIX M-510 and M-520 from Toagosei Co., Ltd.) are also preferred. It is also preferred to use an urethane (meth)acrylate having three or more functional groups. Preferred examples of urethane (meth)acrylates having three or more functional groups that may be used include 8UX-015A (Taisei Fine Chemical Co., Ltd.), UA-32P (Shin Nakamura Chemical Co., Ltd.), and UA-1100H (Shin Nakamura Chemical Co., Ltd.).

The photopolymerizable compound preferably has an average molecular weight of 200 to 3,000, more preferably 250 to 2,600, even more preferably 280 to 2,200.

Preferred examples of thermally polymerizable compounds that may be used include photopolymerizable compounds as mentioned above that are also thermally polymerizable.

The ratio of the polymerizable compound to the binder polymer in the overcoat layers (polymerizable compound content M/binder polymer content B) is preferably 0.1 to 2 times, more preferably 0.2 to 1.5 times, even more preferably 0.3 to 1 time.

Polymerization Initiator

The overcoat layers preferably contain a polymerization initiator. The polymerization initiator may be either a photopolymerization initiator or a thermal polymerization initiator.

The overcoat layers preferably contain a photopolymerization initiator. The use of a photopolymerizable compound and a photopolymerization initiator in the curable transparent resin layer facilitates the patterning of the curable transparent resin layer.

Examples of photopolymerization initiators that may be used in the organic-solvent-based resin composition include those disclosed in paragraphs [0031] to [0042] of Japanese Unexamined Patent Application Publication No. 2011-95716.

Preferred examples of thermal polymerization initiators that may be used include those disclosed in paragraphs [0193] to [0195] of Japanese Unexamined Patent Application Publication No. 2011-32186, the entire content of which is herein incorporated by reference.

The polymerization initiator is preferably present in the overcoat layers in an amount of 1% by mass or more, more preferably 2% by mass or more, of the overcoat layers. The polymerization initiator is preferably present in the overcoat layers in an amount of 10% by mass or less, more preferably 5% by mass or less, of the overcoat layers to improve the ease of patterning and adhesiveness to substrates.

Metal Oxide Particles

The overcoat layers may or may not contain particles (preferably, metal oxide particles) for the control of refractive index and optical transparency. To control the refractive index of the overcoat layers to the above range, the metal oxide particles may be present in any proportion depending on the types of polymer and polymerizable compound used. The metal oxide particles are preferably present in the overcoat layers in an amount of 0% to 35% by mass, more preferably 0% to 10% by mass, of the overcoat layers. Even more preferably, the overcoat layers contain no metal oxide particles.

The use of metal oxide particles, which are optically transparent with high transparency, provides a positive curable resin composition with high refractive index and good transparency.

The metal oxide particles preferably have a higher refractive index than the composition of the overcoat layers excluding these particles.

The term "metal" for the metal oxide particles encompasses metalloids such as B, Si, Ge, As, Sb, and Te.

Preferred examples of optically transparent metal oxide particles with high refractive index include oxide particles containing atoms such as Be, Mg, Ca, Sr, Ba, Sc, Y, La, Ce, Gd, Tb, Dy, Yb, Lu, Ti, Zr, Hf, Nb, Mo, W, Zn, B, Al, Si, Ge, Sn, Pb, Sb, Bi, and Te atoms, more preferably titanium oxide, titanium composite oxide, zinc oxide, zirconium oxide, indium tin oxide, and antimony tin oxide particles, even more preferably titanium oxide, titanium composite oxide, and zirconium oxide particles, yet even more preferably titanium oxide and zirconium oxide particles, most preferably titanium dioxide particles. A preferred titanium dioxide is rutile-type titanium dioxide, which has a particularly high refractive index. These metal oxide particles may be surface-treated with organic materials to impart dispersion stability.

The metal oxide particles preferably have an average primary particle size of 1 to 200 nm, more preferably 3 to 80 nm, for reasons of the transparency of the overcoat layers. As used herein, the term "average primary particle size" refers to the arithmetic mean of the particle sizes of 200 randomly selected particles measured under an electron microscope. The particle size of a nonspherical particle is defined as the length of the longest side of that particle.

These metal oxide particles may be used alone or in a combination of two or more.

The overcoat layers preferably have at least one of $ZrO_2$ particles, $Nb_2O_5$ particles, and $TiO_2$ particles, more preferably at least one of $ZrO_2$ particles and $Nb_2O_5$ particles, to control the refractive index of the overcoat layers to the above range.

Method for Manufacturing Film Sensor

A method for manufacturing a film sensor according to the present invention includes a step of transferring the coloring composition layer from the transfer film according to the present invention to at least one surface of a film sensor to form a decorative layer. The film sensor includes a transparent substrate sheet, an electrode pattern disposed on each side of the substrate sheet, wiring lines connected to the electrode pattern, and an overcoat layer disposed over the electrode pattern.

Formation of Transparent Layers

If the film sensor according to the present invention further has transparent layers having a refractive index of 1.6 to 1.78 and a thickness of 55 to 110 nm, the transparent layers are formed on the transparent substrate sheet, either directly or with another layer therebetween.

Preferably, but not necessarily, the transparent layers are formed by transfer or sputtering.

If the transparent layers are inorganic layers, they are preferably formed by sputtering. Thus, the transparent layers of the laminate are also preferably formed by sputtering.

Preferred sputtering processes that may be used include those disclosed in Japanese Unexamined Patent Application Publication Nos. 2010-86684, 2010-152809, and 2010-257492.

As used herein, the term "transparent" refers to a transmittance of 80% or more for light at wavelengths of 400 to 700 nm.

Formation of Electrode Patterns, Light-Shielding Conductive Layers, and Wiring Lines The electrode patterns, the light-shielding conductive layers, and the wiring lines may be formed on a film substrate using a photosensitive film.

Preferably, at least one of the first electrode pattern 3, the second electrode pattern 4, and the wiring lines 6 is formed using a photosensitive film having, in sequence, a temporary support and a photocurable resin layer. The use of such a photosensitive film to form these elements allows a thin, lightweight sensor integrated with front panel to be manufactured by a simple process.

The electrode patterns and the light-shielding conductive layers are also preferably formed by a method disclosed in paragraphs [0030] to [0042] of Japanese Patent No. 5026580.

Photosensitive Film

A photosensitive film, other than the transfer film according to the present invention, preferred for use in the manufacture of the film sensor according to the present invention or a sensor integrated with front panel, described later, will now be described. The photosensitive film has a temporary support and a photocurable resin layer, preferably with a thermoplastic resin layer between the temporary support and the photocurable resin layer. The use of a photosensitive film having a thermoplastic resin layer to form elements such as the electrode patterns, the light-shielding conductive layers, the wiring lines, and the second decorative layer leaves fewer bubbles around the elements formed by the transfer of the photocurable resin layer, thus providing an image display device with less image unevenness and better display characteristics.

The photosensitive film may be either a negative photosensitive film or a positive photosensitive film.

Layers Other Than Photocurable Resin Layer and Method for Fabrication Thereof

Examples of temporary supports and thermoplastic resin layers that may be used for the photosensitive film include thermoplastic resin layers disclosed in paragraphs [0041] to [0047] of Japanese Unexamined Patent Application Publication No. 2014-108541. The photosensitive film may be fabricated as disclosed in paragraphs [0041] to [0047] of Japanese Unexamined Patent Application Publication No. 2014-108541.

Photocurable Resin Layer

Depending on the application, additives are added to the photocurable resin layer of the photosensitive film. Specifically, if the photosensitive film is used to form the second decorative layer, the photocurable resin layer contains a colorant. If a photosensitive film having a conductive photocurable resin layer is used to form the electrode patterns, the light-shielding conductive layers, or the wiring lines, the photocurable resin layer contains, for example, conductive fibers.

If the photosensitive film is a negative photosensitive film, the photocurable resin layer preferably contains an alkali-soluble resin, a polymerizable compound, and a polymerization initiator. Other materials may also be used, including, but not limited to, conductive fibers, colorants, and other additives.

Alkali-Soluble Resin, Polymerizable Compound, and Polymerization Initiator

The alkali-soluble resin, the polymerizable compound, and the polymerization initiator used in the photosensitive film may be similar to those used in the transfer film according to the present invention.

Conductive Fibers (for Use as Conductive Photocurable Resin Layer)

If a photosensitive film having a conductive photocurable resin layer is used to form the electrode patterns or the wiring lines, the photocurable resin layer may contain, for example, the following conductive fibers.

Although the conductive fibers may have any suitable structure selected depending on the purpose, they preferably have a solid structure or a hollow structure.

Fibers having a solid structure may be referred to as "wires", whereas fibers having a hollow structure may be referred to as "tubes". Conductive fibers having an average short axis length of 1 to 1,000 nm and an average long axis length of 1 to 100 μm may be referred to as "nanowires".

Conductive fibers having a hollow structure and having an average short axis length of 1 to 1,000 nm and an average long axis length of 0.1 to 1,000 μm may be referred to as "nanotubes".

Although the conductive fibers may be formed of any suitable conductive material selected depending on the purpose, they are preferably formed of at least one of a metal and carbon. More preferably, the conductive fibers are at least one of metal nanowires, metal nanotubes, and carbon nanotubes.

The metal nanowires may be formed of metal. For example, the metal nanowires preferably contain at least one metal selected from the group consisting of period 4, 5, and 6 elements in the long form of the periodic table (IUPAC 1991), more preferably at least one metal selected from the group consisting of group 2 to 14 elements, even more preferably at least one metal selected from the group consisting of group 2, 8, 9, 10, 11, 12, 13, and 14 elements, which is preferably present as a major component.

Examples of such metals include copper, silver, gold, platinum, palladium, nickel, tin, cobalt, rhodium, iridium, iron, ruthenium, osmium, manganese, molybdenum, tungsten, niobium, tantalum, titanium, bismuth, antimony, lead, and alloys thereof. In particular, metal nanowires mainly containing silver and metal nanowires containing an alloy of silver with another metal are preferred for their good conductivity.

By "mainly containing silver", it is meant that the metal nanowires contain silver in an amount of 50% by mass or more, preferably 90% by mass or more.

Examples of metals that may be alloyed with silver include platinum, osmium, palladium, and iridium. These metals may be used alone or in a combination of two or more.

The metal nanowires may be of any suitable shape selected depending on the purpose. For example, the metal nanowires may be of any shape such as a cylinder, a rectangular parallelepiped, or a prism having a polygonal cross-section. Metal nanowires that are cylindrical or have a polygonal cross-section with rounded corners are preferred for applications requiring high transparency.

The cross-sectional shape of the metal nanowires may be determined by applying an aqueous dispersion of the metal nanowires to a substrate and examining a cross-section under a transmission electron microscope (TEM).

Figure 9:
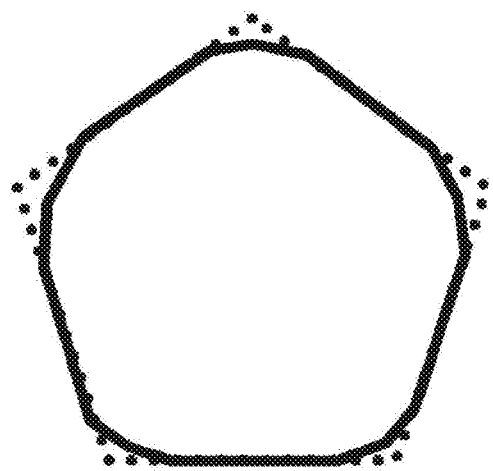
FIG. 9 is an illustration showing a cross-section of a metal nanowire.

The term "corner of the cross-section of the metal nanowires" refers to the area around a point where extensions of two adjacent sides of the cross-section intersect. The term "side of the cross-section" refers to a straight line joining two adjacent corners. As used herein, sharpness is defined as the percentage of the perimeter of the cross-section to the total length of the sides of the cross-section. For example, the sharpness of the cross-section of the metal nanowire shown in FIG. 9 may be represented as the percentage of the perimeter of the cross-section indicated by the solid line to the perimeter of the pentagon indicated by the dotted line. A cross-sectional shape with rounded corners is defined as a cross-sectional shape having a sharpness of 75% or less. Preferably, the sharpness is 60% or less, more preferably 50% or less. A sharpness of more than 75% may result in low transparency because, for example, electrons localized at the corners give a yellowish appearance due to increased plasmon absorption. The edge of the pattern may also have low linearity and may thus be irregular in shape. The lower limit of the sharpness is preferably 30%, more preferably 40%.

The metal nanowires preferably have an average short axis length (also referred to as "average short axis size" or "average diameter") of 150 nm or less, more preferably 1 to 40 nm, even more preferably 10 to 40 nm, yet even more preferably 15 to 35 nm.

An average short axis length of less than 1 nm may result in low oxidation resistance and thus low durability, whereas an average short axis length of more than 150 nm may result in scattering due to the metal nanowires and thus insufficient transparency.

The average short axis length of the metal nanowires is determined by examining 300 metal nanowires under a transmission electron microscope (TEM; JEM-2000FX from JEOL Ltd.) and calculating the average of the short axis lengths of these metal nanowires.

The short axis length of a metal nanowire having a noncircular short axis is defined as the length of the longest short axis.

The metal nanowires preferably have an average long axis length (also referred to as "average length") of 1 to 40 µm, more preferably 3 to 35 µm, even more preferably 5 to 30 µm.

An average long axis length of less than 1 µm may make it difficult to form a dense network and may thus result in insufficient conductivity, whereas an average long axis length of more than 40 µm may result in the formation of aggregates during the manufacturing process due to tangling of excessively long metal nanowires during manufacture.

The average long axis length of the metal nanowires is determined, for example, by examining 300 randomly selected metal nanowires under a transmission electron microscope (TEM; JEM-2000FX from JEOL Ltd.) and calculating the average of the long axis lengths of these metal nanowires. The long axis length of a curved metal nanowire is calculated from the radius and curvature of a circle having an arc formed by the metal nanowire.

The conductive photocurable resin layer preferably has a thickness of 0.1 to 20 µm, more preferably 0.5 to 18 µm, even more preferably 1 to 15 µm, for reasons of process suitability, including the stability of the coating solution and the times needed for drying after coating and development during patterning.

The content of the conductive fibers based on the total solid content of the conductive photocurable resin layer is preferably 0.01% to 50% by mass, more preferably 0.05% to 30% by mass, even more preferably 0.1 to 20% by mass, for reasons of conductivity and the stability of the coating solution.

Colorant (for Use as Second Decorative Layer)

If the photosensitive film is used to form the second decorative layer, a colorant may be used in the photocurable resin layer. Examples of suitable colorants that may be used in the photocurable resin layer include known colorants (e.g., organic pigments, inorganic pigments, and dyes).

If the photocurable resin layer is used to form a black second decorative layer, it preferably contains a black colorant for reasons of optical density. Examples of black colorants include carbon black, titanium carbide, iron oxide, titanium oxide, and graphite, preferably carbon black. Examples of colorants other than black colorants that may be used in the photocurable resin layer include mixtures of pigments of different colors such as red, blue, and green.

If the photocurable resin layer is used to form a white second decorative layer, white pigments disclosed in paragraphs [0015] and [0114] of Japanese Unexamined Patent Application Publication No. 2005-7765 may be used. If the photocurable resin layer is used to form a second decorative layer of another color, pigments and dyes such as those disclosed in paragraphs [0183] to [0185] of Japanese Patent No. 4546276 may be used in mixture. Specific examples of suitable colorants that may be used include pigments and dyes disclosed in paragraphs [0038] to [0054] of Japanese Unexamined Patent Application Publication No. 2005-17716, pigments disclosed in paragraphs [0068] to [0072] of Japanese Unexamined Patent Application Publication No. 2004-361447, and colorants disclosed in paragraphs [0080] to [0088] of Japanese Unexamined Patent Application Publication No. 2005-17521.

It is desirable to use the colorant (preferably a pigment, more preferably carbon black) in the form of a dispersion. The dispersion may be prepared by premixing the colorant with a pigment dispersing agent and adding and dispersing the resulting composition in an organic solvent (or vehicle), described later. The term "vehicle" refers to the medium portion of a liquid coating in which a pigment is dispersed, including a liquid component (binder) that binds with the pigment to form a layer and a component (organic solvent) that dissolves and dilutes the binder.

The pigment may be dispersed with any disperser, including known dispersers such as kneaders, roller mills, attritors, supermills, dissolvers, homomixers, sand mills, and bead mills, as disclosed in Kunizo Asakura, "Ganryo No Jiten (Encyclopedia of Pigments)", 1st edition, Asakura Publishing Co. Ltd., 2000, p. 438.

The pigment may also be pulverized by friction using a mechanical grinding technique disclosed in p. 310 of the same literature.

The colorant preferably has a number average particle size of 0.001 to 0.1 µm, more preferably 0.01 to 0.08 µm, for reasons of dispersion stability. As used herein, the term "particle size" refers to the diameter of a circle having the same area as an electron micrograph of a particle. The term "number average particle size" refers to the average particle size of 100 particles randomly selected from many particles whose particle sizes have been determined.

The photocurable resin layer containing a colorant preferably has a thickness of 0.5 to 10 µm, more preferably 0.8 to 5 µm, even more preferably 1 to 3 µm, taking into account the difference in thickness between this and other layers. The content of the colorant based on the solid content of the coloring composition is preferably, but not limited to, 15% to 70% by mass, more preferably 20% to 60% by mass, even more preferably 25% to 50% by mass, to sufficiently reduce the development time.

As used herein, the term "total solid content" refers to the total mass of nonvolatile components, excluding components such as solvents, in the coloring composition.

If the photosensitive film is used to form an insulating layer, the photocurable resin layer preferably has a thickness of 0.1 to 5 µm, more preferably 0.3 to 3 µm, even more preferably 0.5 to 2 µm, to maintain sufficient insulation.

Other Additives

Other additives may also be used in the photocurable resin layer. These additives may be similar to those used in the transfer film according to the present invention.

The solvent used for coating in the manufacture of the photosensitive film may be similar to that used in the transfer film according to the present invention.

Although an example where the photosensitive film is a negative photosensitive film has been primarily described above, the photosensitive film may also be a positive photosensitive film. If the photosensitive film is a positive photosensitive film other materials may be used in the photocurable resin layer, including, but not limited to, those disclosed in Japanese Unexamined Patent Application Publication No. 2005-221726.

Formation of First and Second Electrode Patterns and Wiring Lines Using Photosensitive Film The first electrode pattern 3, the second electrode pattern 4, and the wiring lines 6 may be formed by etching, by using a photosensitive film having a conductive photocurable resin layer, or by using the photosensitive film as a liftoff material.
Etching If the first electrode pattern 3, the second electrode pattern 4, and the wiring lines 6 are formed by etching, a transparent electrode layer such as an ITO layer is first formed by sputtering on the side (noncontact side) of a front panel 1 on which elements such as the second decorative layer 2 are formed. An etching photocurable resin layer is then transferred from the photosensitive film to the transparent electrode layer and is exposed and developed to form an etching pattern. The transparent electrode layer is then patterned by etching, followed by removing the etching pattern. In this way, elements such as the first electrode pattern 3 can be formed.

If the photosensitive film is used as an etching resist (etching pattern), a resist pattern may be formed as described above. Etching and resist removal may be performed by known methods such as those disclosed in paragraphs [0048] to [0054] of Japanese Unexamined Patent Application Publication No. 2010-152155.

An example etching process is wet etching, which is a commonly used process involving immersion in an etchant. The etchant used for wet etching may be any suitable acidic or alkaline etchant selected depending on the etching target. Examples of acidic etchants include simple aqueous solutions of acidic components such as hydrochloric acid, sulfuric acid, hydrofluoric acid, and phosphoric acid and mixtures thereof with salts such as ferric chloride, ammonium fluoride, and potassium permanganate. These acidic components may be used in combination. Examples of alkaline etchants include simple aqueous solutions of alkaline components such as sodium hydroxide, potassium hydroxide, ammonia, organic amines, and organic amine salts such as tetramethylammonium hydroxide and mixtures thereof with salts such as potassium permanganate. These alkaline components may be used in combination.

The etchant temperature is preferably, but not limited to, 45° C. or lower. If the photocurable resin layer described above is used to form a resin pattern serving as an etching mask (etching pattern) in the present invention, the resin pattern exhibits particularly good resistance to acidic and alkaline etchants in such a temperature range. This prevents the resin pattern from peeling during the etching step and thus allows the area where no resin pattern is present to be selectively etched.

Optionally, etching may be followed by cleaning and drying steps to prevent line contamination. For example, in the cleaning step, the substrate may be cleaned with pure water at room temperature for 10 to 300 seconds. In the drying step, air blowing may be performed at an appropriate air blow pressure (about 0.1 to 5 kg/cm$^2$).

The resin pattern may be stripped in any manner, including the immersion of the substrate in a stripping solution at 30° C. to 80° C., preferably 50° C. to 80° C., with stirring for 5 to 30 minutes. The resin pattern used as the etching mask in the present invention, which, as described above, exhibits good chemical resistance at 45° C. or lower, also exhibits the property of swelling with an alkaline stripping solution at a chemical temperature of 50° C. or higher. This property has the advantage of reducing the time needed for stripping with a stripping solution at 50° C. to 80° C. and leaving less residue after the stripping of the resin pattern. Thus, the difference in chemical temperature between the etching step and the stripping step allows the resin pattern used as the etching mask in the present invention to exhibit good chemical resistance in the etching step while exhibiting good strippability in the stripping step. This satisfies two contradictory properties, i.e., chemical resistance and strippability.

Examples of stripping solutions include solutions of inorganic alkaline components such as sodium hydroxide and potassium hydroxide and organic alkaline components such as tertiary amines and quaternary ammonium salts in solvents such as water, dimethyl sulfoxide, N-methylpyrrolidone, and mixtures thereof. The resin pattern may be stripped with the stripping solution by processes such as spray stripping, shower stripping, and puddle stripping.
Photosensitive Film Having Conductive Photocurable Resin Layer If a photosensitive film having a conductive photocurable resin layer is used to form the first electrode pattern 3, the second electrode pattern 4, and the wiring lines 6, they may be formed by transferring the conductive photocurable resin layer to a surface of the front panel 1.

If a photosensitive film having a conductive photocurable resin layer is used to form elements such as the first electrode pattern 3, no resist component leaks from an opening if the substrate (front panel) has an opening. This allows a thin, lightweight touch panel to be manufactured by a simple process without the contamination of the backside of the substrate.

In addition, if a photosensitive film having a particular layer structure, i.e., a photosensitive film having a thermoplastic resin layer between a conductive photocurable resin layer and a temporary support, is used to form elements such as the first electrode pattern 3, a first electrode pattern 3, a second electrode pattern 4, and wiring lines 6 with high conductivity and low resistance can be formed without leaving bubbles during the lamination of the photosensitive film.
Use of Photosensitive Film as Liftoff Material The photosensitive film may also be used as a liftoff material to form the first transparent electrode layer, the second transparent electrode layer, and the wiring lines.

In this case, the desired transparent conductive layer pattern can be formed by performing patterning using the photosensitive film, forming a transparent conductive layer over the entire surface of the substrate, and dissolving and removing the photocurable resin layer together with the transparent conductive layer deposited thereon (liftoff process).
Step of Forming Overcoat Layers In the method for manufacturing a film sensor, the overcoat layers 7 may be formed by transferring an overcoat layer from a transfer film to a surface of the film substrate 1A after the formation of various elements.

The step of forming the overcoat layers is preferably a transfer (bonding) step. The term "transfer step" refers to the bonding of an overcoat layer of a transfer film to any material (e.g., a substrate having formed thereon various elements such as electrode patterns, light-shielding conductive layers, and wiring lines) as a result of lamination. The method preferably includes a step of removing the temporary support after the lamination of the overcoat layer of the transfer film on the substrate.

By this step, the overcoat layers are formed over the electrode patterns.

The step of forming the overcoat layers on the substrate having formed thereon various elements such as electrode patterns, light-shielding conductive layers, and wiring lines is preferably performed by placing an overcoat layer on a surface of the substrate and then pressing and heating the overcoat layer.

The step of forming the overcoat layers on the substrate may be performed using a known laminator such as a laminator, a vacuum laminator, or an automatic cutting laminator, which provides a higher productivity. The laminator preferably includes any heatable roller, such as a rubber roller, capable of pressing and heating.

In the step of forming the overcoat layers, the overcoat layers are preferably bonded to the substrate at a temperature of 60° C. to 150° C., more preferably 65° C. to 130° C., even more preferably 70° C. to 100° C.

In the step of forming the overcoat layers, the overcoat layers and the substrate are preferably subjected to a linear pressure of 60 to 200 N/cm, more preferably 70 to 160 N/cm, even more preferably 80 to 120 N/cm.

In the step of forming the overcoat layers, the overcoat layers are preferably transported at a speed of 2.0 m/min or more, more preferably 3.0 m/min or more, even more preferably 4.0 m/min or more. The entry of bubbles can be reduced during such high-speed lamination on the substrate.

The method for manufacturing a film sensor preferably has a step of exposing the overcoat layers and a step of developing the exposed overcoat layers.

The steps of exposing and developing the overcoat layers will be described later.

Step of Forming Decorative Layer

The method for manufacturing a film sensor according to the present invention includes a step of forming a decorative layer.

The step of forming a decorative layer is a step of transferring the coloring composition layer from the transfer film according to the present invention to at least one surface of a film sensor to form a decorative layer. The film sensor includes a transparent substrate sheet, an electrode pattern disposed on each side of the substrate sheet, wiring lines connected to the electrode pattern, and an overcoat layer disposed over the electrode pattern.

In the method for manufacturing a film sensor, the decorative layer is preferably formed by transferring the coloring composition layer from the transfer film according to the present invention to a surface of an overcoat layer of the film sensor having various elements formed thereon.

In the method for manufacturing a film sensor according to the present invention, the surface of the film sensor to which the coloring composition layer is transferred preferably includes at least a region of the wiring lines and at least a region of the overcoat layer.

If the transfer film according to the present invention includes a protective film, the method for manufacturing a film sensor preferably includes a step of removing the protective film from the transfer film according to the present invention before the step of forming the decorative layer.

Exposure and Development Steps

The method for manufacturing a film sensor preferably has a step of exposing the overcoat layers transferred to the substrate (for a substrate having no overcoat layer formed thereon, exposing a curable transparent resin layer or a coloring composition layer and preferably further exposing a second transparent resin layer) and a step of developing the exposed overcoat layers (for a substrate having no overcoat layer formed thereon, developing a curable transparent resin layer or a coloring composition layer and preferably further developing a second transparent resin layer).

Examples of exposure, development, and other processes suitable for use in the present invention include those disclosed in paragraphs [0035] to [0051] of Japanese Unexamined Patent Application Publication No. 2006-23696.

The exposure step is a step of exposing, for example, a curable transparent resin layer or a coloring composition layer transferred to the electrode patterns.

A specific example of an exposure process includes placing a predetermined mask above the curable transparent resin layer or the coloring composition layer formed on the electrode patterns and then exposing the curable transparent resin layer or the coloring composition layer through the mask and the temporary support from above the mask.

Any suitable exposure light source may be selected and used that can irradiate the curable transparent resin layer or the coloring composition layer with light in a wavelength range where the curable transparent resin layer or the coloring composition layer can be cured (e.g., at 365 or 405 nm). Specific examples of light sources include ultrahigh-pressure mercury lamps, high-pressure mercury lamps, and metal halide lamps. The exposure dose is typically about 5 to 200 mJ/cm$^2$, preferably about 10 to 100 mJ/cm$^2$.

The development step is a step of developing, for example, the exposed curable transparent resin layer or the coloring composition layer.

The development step in the present invention is a development step (in a narrow sense) where, for example, the curable transparent resin layer or the coloring composition layer that has been subjected to pattern exposure is subjected to pattern development with a developer.

The development may be performed using a developer. Any developer may be used, including known developers such as those disclosed in Japanese Unexamined Patent Application Publication No. 5-72724. The developer preferably exhibits a development behavior in which it dissolves the photocurable resin layer or the coloring composition layer. For example, the developer preferably contains a compound having a pKa of 7 to 13 in a concentration of 0.05 to 5 mol/L. If the curable transparent resin layer or the coloring composition layer itself does not form a pattern, the developer preferably exhibits a development behavior in which it does not dissolve a non-alkali-development coloring composition layer. For example, the developer preferably contains a compound having a pKa of 7 to 13 in a concentration of 0.05 to 5 mol/L. A small amount of a water-miscible organic solvent may also be added to the developer. Examples of water-miscible organic solvents include methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, acetone, methyl ethyl ketone, cyclohexanone, ε-caprolactone, γ-butyrolactone, dimethylformamide, dimethylacetamide, hexamethylphosphoramide, ethyl lactate, methyl lactate, ε-caprolactam, and N-methylpyrrolidone. The concentration of the organic solvent is preferably 0.1% to 30% by mass.

A known surfactant may also be added to the developer. The concentration of the surfactant is preferably 0.01% to 10% by mass.

The type of development may be, for example, puddle development, shower development, shower and spin development, or dip development. Shower development will be described herein. This type of development includes showering, for example, the exposed curable transparent resin layer or coloring composition layer with a developer to remove any uncured portion. After the development, any residue is preferably removed, for example, by showering with a cleaning agent and rubbing with a brush. The temperature of the developer is preferably 20° C. to 40° C. The pH of the developer is preferably 8 to 13.

Heat Treatment

The method for manufacturing a film sensor preferably includes a step of heating the film sensor at 130° C. to 170° C. (post-baking step) after the step of transferring the coloring composition layer. Heat treatment at such temperatures does not adversely affect other members, such as the electrode patterns, the wiring lines, the light-shielding conductive layers, and the overcoat layers, that are formed on the film substrate in advance before the formation of the decorative layer in the method for manufacturing a film sensor.

The heat treatment temperature is preferably 140° C. to 160° C., more preferably 140° C. to 150° C.

The heat treatment time is preferably 1 to 60 minutes, more preferably 10 to 60 minutes, even more preferably 20 to 50 minutes.

Other Steps

The method for manufacturing a film, sensor may have a post-exposure step and other steps.

Patterning exposure or whole-image exposure may be performed after the removal of the temporary support. Alternatively, the exposure may be performed before the removal of the temporary support, and the temporary support may be removed. The exposure may be mask exposure or digital exposure using, for example, a laser.

Sensor Integrated with Front Panel

A sensor integrated with front panel according to the present invention has a transparent front panel and a film sensor according to the present invention.

The sensor integrated with front panel is preferably a capacitive input device.

A sensor integrated with front panel according to a preferred embodiment of the present invention will now be described in detail.

Structure of Sensor integrated with Front Panel

A preferred structure of the sensor integrated with front panel according to the present invention will be first described together with the methods for manufacturing various members that form the device.

Figure 1:
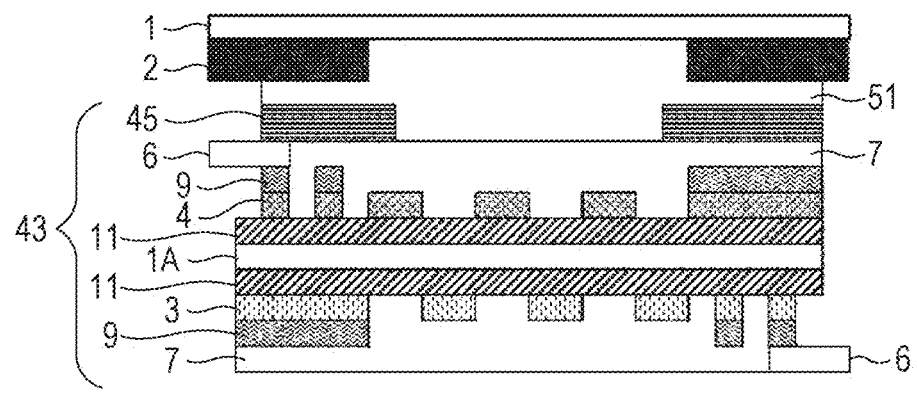
FIG. 1 is a schematic sectional view showing an example structure of a sensor integrated with front panel according to the present invention.

FIG. 1 is a sectional view showing a preferred structure of the sensor integrated with front panel according to the present invention. In the example shown in FIG. 1, the sensor integrated with front panel is composed of a transparent substrate (front panel) 1, a second decorative layer (mask layer) 2, and a film sensor 43 according to the present invention.

In FIG. 1, the side of the transparent front panel 1 on which various elements are disposed is referred to as "noncontact side". A user provides an input to the sensor integrated with front panel according to the present invention, for example, by touching the contact surface (surface opposite the noncontact surface) of the transparent front panel 1 with a finger.

The transparent front panel of the sensor integrated with front panel according to the present invention is preferably formed of a glass.

More preferably, the transparent front panel is a glass substrate with a refractive index of 1.5 to 1.55. Even more preferably, the transparent front panel is a glass substrate with a refractive index of 1.5 to 1.52. The transparent front panel is composed of an optically transparent substrate such as a glass substrate, for example, a strengthened glass such as Corning Gorilla Glass ("Gorilla" is a registered trademark). Preferred examples of materials that may be used for the transparent front panel include those used in Japanese Unexamined Patent Application Publication Nos. 2010-86684, 2010-152809, and 2010-257492.

Figure 2:
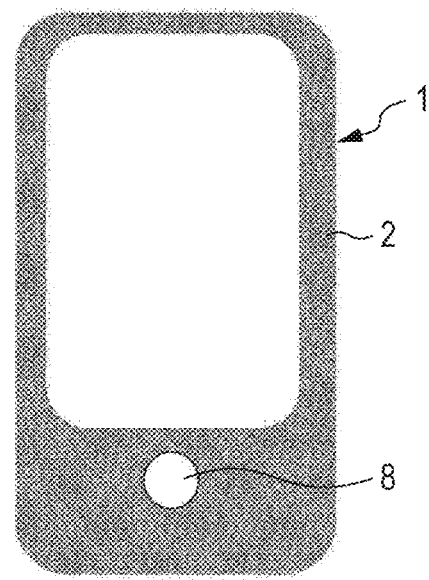
FIG. 2 is an illustration showing an example of front panel in the present invention.

As shown in FIG. 2, the transparent front panel 1 may have an opening 8. A mechanical pushbutton switch may be provided in the opening 8.

The sensor integrated with front panel according to the present invention preferably has a second decorative layer in a region of one surface of the transparent front panel.

In FIG. 1, a second decorative layer 2 is disposed on the noncontact surface of the transparent front panel 1. The second decorative layer 2 is formed in a picture-frame-like (frame-like) pattern around the display region on the noncontact side of the touch panel front panel so that elements such as the wiring lines 6 are not visible from the contact side.

As shown in FIG. 2, the second decorative layer 2 of the sensor integrated with front panel is preferably disposed over a region of the transparent front panel 1 (in FIG. 2, the region other than the input surface).

The second decorative layer is disposed in a picture-frame-like pattern around the surface opposite the region of the contact surface that is to be touched, for example, with a finger or a touch pen. The second decorative layer is provided so that the wiring lines for the electrode patterns are not visible from the contact side or is provided for decorative purposes. The second decorative layer is preferably a black or white second decorative layer.

More preferably, the second decorative layer is disposed adjacent to the transparent front panel.

The second decorative layer 2 preferably has a thickness of 7 to 30 μm.

The second decorative layer of the sensor integrated with front panel according to the present invention is preferably disposed between the transparent front panel and the decorative layer of the film sensor.

The orthogonal projection of the second decorative layer of the sensor integrated with front panel according to the present invention preferably overlaps at least a region of the decorative layer of the film sensor as viewed in a direction normal to the transparent front panel.

The inner edges of the decorative layer 45 of the film sensor are preferably located closer to the center than the inner edges of the second decorative layer 2.

More preferably, the distance between the surface of the transparent front panel 1 on which the second decorative layer is formed and the decorative layer 45 of the film sensor is 10 to 100 μm. A distance of 10 μm or more results in sufficient adhesive thickness and thus high adhesiveness between the film sensor and the transparent front panel 1. A distance of 100 μm or less results in high visual integrity of the portion around the display screen.

Method for Manufacturing Sensor integrated with Front Panel

Figure 4:
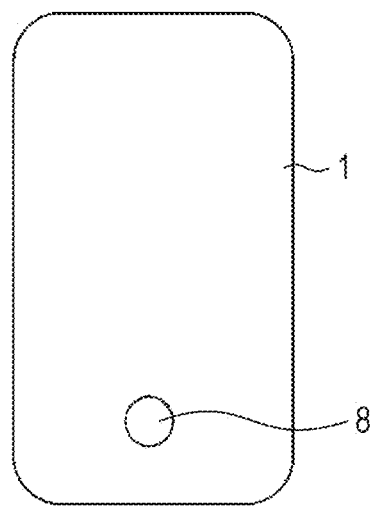
FIG. 4 is a top view showing an example of strengthened glass having an opening formed therein.
Figure 5:
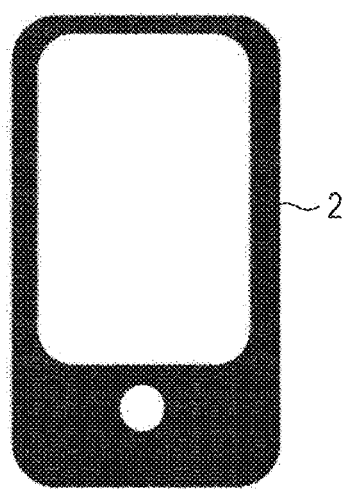
FIG. 5 is a top view showing an example of sensor integrated with front panel in which a second decorative layer is formed.

FIGS. 4 to 8 show example structures formed during the manufacture of a sensor integrated with front panel according to the present invention. FIG. 4 is a top view showing an example strengthened glass transparent front panel 1 having an opening 8 formed therein. FIG. 5 is a top view showing an example sensor integrated with front panel in which the second decorative layer 2 is formed.

Figure 6:
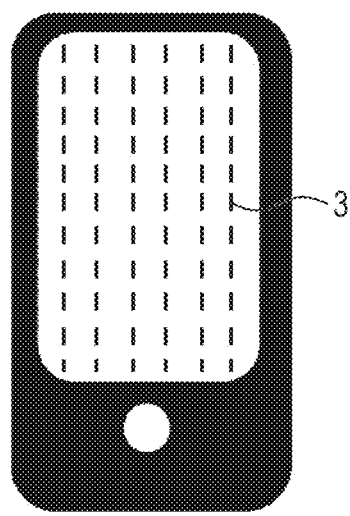
FIG. 6 is a top view showing an example of sensor integrated with front panel in which a first electrode pattern is formed.
Figure 7:
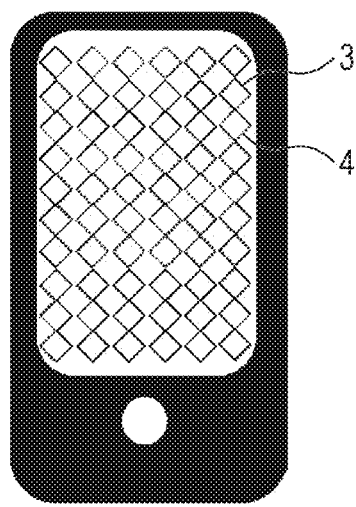
FIG. 7 is a top view showing an example of sensor integrated with front panel in which first and second electrode patterns are formed.
Figure 8:
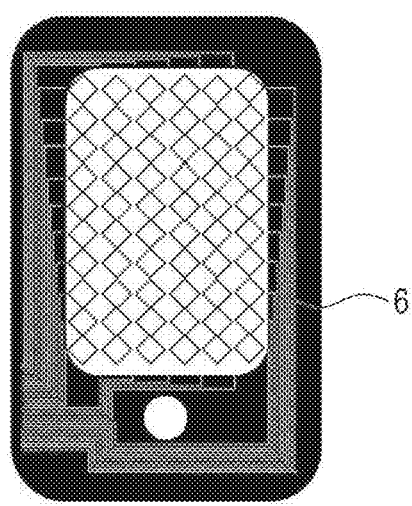
FIG. 8 is a top view showing an example of sensor integrated with front panel in which wiring lines are formed.

FIGS. 6 to 8 show example structures of a sensor integrated with front panel in which a film sensor is stacked. FIG. 6 is a top view showing an example sensor integrated with front panel in which a film sensor is stacked to form the first electrode pattern 3. FIG. 7 is a top view showing an example sensor integrated with front panel in which a film sensor is stacked to form the first electrode pattern 3 and the second electrode pattern 4. FIG. 8 is a top view showing an example sensor integrated with front panel in which a film sensor is stacked to form the first and second electrode patterns and the wiring lines 6. These drawings illustrate the example structure described below and should not be construed as limiting the scope of the present invention.

In the method for manufacturing a sensor integrated with front panel, the second decorative layer 2 is preferably formed using a photosensitive film having, in sequence, a temporary support and a photocurable resin layer.

If the transfer film according to the present invention or the photosensitive film described above is used to form the second decorative layer, no resist component leaks from an opening in the substrate (front panel) if the substrate has an opening. In particular, if the second decorative layer needs to be formed as a light-shielding pattern extending to the boundaries of the front panel, no resist component flows (leaks) from the edges of the glass. This allows a thin, lightweight sensor integrated with front panel to be manufactured by a simple process without the contamination of the backside of the front panel.

If the photosensitive film is used to form the second decorative layer, the photosensitive film may be laminated on the substrate and may then optionally be exposed in a pattern. If the photosensitive film is a negative photosensitive film, the unexposed portion may be removed by development to form a pattern. If the photosensitive film is a positive photosensitive film, the exposed portion may be removed by development to form a pattern. The thermoplastic resin layer and the photocurable resin layer may be removed by development with the same solution or different solutions. Optionally, known developing units such as brush developing units and high-pressure jet developing units may be used in combination. The development may optionally be followed by post-exposure and post-baking.

Formation of Second Decorative Layer Using Photosensitive Film

The second decorative layer 2 may be formed using the photosensitive film by transferring the photocurable resin layer to a substrate such as the transparent front panel 1. For example, a black second decorative layer 2 may be formed using a photosensitive film having a black photocurable resin layer by transferring the black photocurable resin layer to a surface of the transparent front panel 1.

In addition, if a photosensitive film having a particular layer structure, i.e., a photosensitive film having a thermoplastic resin layer between a photocurable resin layer and a temporary support, is used to form a second decorative layer 2 requiring light-shielding properties, a high-quality second decorative layer 2 that allows no light to leak can be formed without leaving bubbles after the lamination of the photosensitive film.

Image Display Device

An image display device according to the present invention includes, a sensor integrated with front panel according to the present invention.

The sensor integrated with front panel according to the present invention and the image display device including, the sensor integrated with front panel may be configured as disclosed in, for example, "Saishin Tacchi Paneru Gijutu (Latest Touch Panel Technology)" (issued on Jul. 6, 2009, Techno-Times, Co., Ltd.); Yuji "Tacchi Paneru No Gijutu To Kaihatu (Touch Panel Technology and Development)", CMC Publishing Co., Ltd. (December 2004); FPD International 2009 Forum T-11 lecture textbook; and Cypress Semiconductor Corporation Application Note AN2292.

EXAMPLES

The present invention is further illustrated by the following examples. The types, amounts, and ratios of materials used, the types and sequences of steps, and other details of the following examples may be changed without departing from the spirit of the invention. Thus, the following examples are not intended to limit the scope of the invention. Parts and percentages are by mass unless otherwise specified.

Example 1

Preparation of Coloring Composition

K Pigment Dispersion 1 was prepared by mixing carbon black, a dispersing agent, a polymer, and a solvent using a three-roll mill and a bead mill so that the mixture had the following composition.

Black Composition K1 (coloring composition), serving as a coloring composition for forming a coloring composition layer, was prepared by the following procedure.

K Pigment Dispersion 1 of which amounts shown in Table 1 and propylene glycol monomethyl ether acetate (MMP-GAc) were mixed and stirred at 24° C. (±2° C.) and 150 revolutions per minute (rpm) for 10 minutes. Methyl ethyl ketone, 1-methoxy-2-propyl acetate, a binder, phenothiazine, polymerizable compounds, a polymerization initiator, and a surfactant were then weighed out in the amounts shown in Table 1 and were added, in the above order, to the mixture under 25° C. (±2° C.), and the mixture was stirred at 24° C. (±2° C.) and 150 rpm for 30 minutes.

The amounts shown in Table 1 are expressed in parts by mass.

K Pigment Dispersion 1

Resin-coated carbon black prepared as disclosed in paragraphs [0036] to [0042] of Japanese Patent No. 5320652: 13.1% by mass Dispersing Agent 1 below: 0.65% by mass Polymer (random copolymer with molar ratio of benzyl methacrylate/methacrylic acid of 72/28, weight average molecular weight=37,000): 6.72% by mass Propylene glycol monomethyl ether acetate: 79.53% by mass

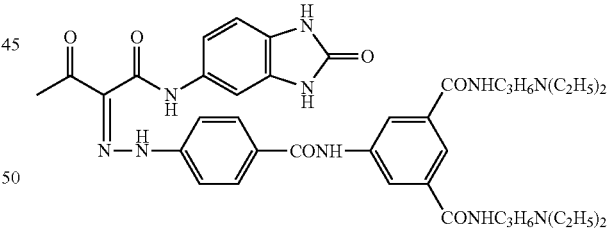

Dispersing Agent 1

Fabrication of Transfer Film

A thermoplastic resin layer coating solution of Formulation H1 below was applied to a polyethylene terephthalate film temporary support having a thickness of 75 μm through a slit nozzle and was dried. An interlayer coating solution of Formulation P1 below was then applied and dried, Black Composition K1, serving as a coloring composition for forming a coloring composition layer, was then applied and dried. In this way, a thermoplastic resin layer having a dry thickness of 15.1 μm, an interlayer having a dry thickness of 1.6 μm, and a black coloring composition layer having a dry thickness of 2.0 μm were formed on the temporary support. Finally, a protective film (12 μm thick polypropylene film) was bonded with pressure. Thus, a transfer film of Example 1 was fabricated in which the temporary support, the thermoplastic resin layer, the interlayer (oxygen-blocking layer), the black (K) coloring composition layer, and the protective film were combined together.

Thermoplastic Resin Layer Coating Solution: Formulation H1

Methanol: 11.1 parts by mass

Propylene glycol monomethyl ether acetate: 6.36 parts by mass

Methyl ethyl ketone: 52.4 parts by mass

Methyl methacrylate/2-ethylhexyl acrylate/benzyl methacrylate/methacrylic acid copolymer (copolymer compositional ratio (molar ratio)=55/11.7/4.5/28.8, molecular weight=100,000, Tg≈70° C.): 5.83 parts by mass Styrene/acrylic acid copolymer (copolymer compositional ratio (molar ratio)=63/37, weight average molecular weight 10,000, Tg≈100° C.): 13.6 parts by mass 2,2-Bis[4-(methacryloxypolyethoxy)phenyl]propane (Shin Nakamura Chemical Co., Ltd.): 9.1 parts by mass Fluoropolymer (copolymer of 40 parts of $C_6F_{13}CH_2CH_2OCOCH=CH_2$, 55 parts of $H(OCH(CH_3)CH_2)_7OCOCH\pm CH_2$, and 5 parts of $H(OCH_2CH_2)_7OCOCH=CH_2$, weight average molecular weight=30,000, 30% by mass solution in methyl ethyl ketone, DIC Corporation, the trade name Megaface F780F): 0.54 part by mass Interlayer Coating Solution: Formulation PI PVA205 (polyvinyl alcohol Kuraray Co., Ltd., degree of saponification=88%, degree of polymerization=550): 32.2 parts by mass Polyvinylpyrrolidone (K-30, ISP Japan Ltd.): 14.9 parts by mass Distilled water: 524 parts by mass Methanol: 429 parts by mass Optical Density Evaluation The resulting transfer film of Example 1 was tested for optical density using an X-Rite 361T(V) (Sakata Inx Eng. Co., Ltd.). Larger values are preferred. A, B, and C are acceptable for practical use. A and B are preferred, and A is more preferred.

Evaluation Scale

A: 3.4 or more
B: 2.5 to less than 3.4
C: 1.1 to less than 2.5
D: 0.6 to less than 1.1
E: less than 0.6

The results are summarized in Table 3 below.

Sensitivity Evaluation

The protective film was removed from the resulting transfer film of Example 1, and the bare surface of the black coloring composition layer was placed on a surface of a cycloolefin copolymer film (COP film, the trade name TOPAS 5013L-10, TOPAS Advanced Polymers GmbH), serving as a substrate. The transfer film and the COP film were laminated together using a laminator (Hitachi Industries Co., Ltd. (Lamic II)) at a rubber roller temperature of 130° C., a linear pressure of 100 N/cm, and a transport speed of 2.2 m/min. The polyethylene terephthalate temporary support was then stripped and removed from the interface with the thermoplastic resin layer. After the stripping of the temporary support, the laminate was subjected to pattern exposure at an exposure dose of 70 mJ/cm² using a proximity exposure system (Hitachi High-Tech Electronics Engineering Co., Ltd.) having an ultrahigh-pressure mercury lamp. The substrate and the mask (quartz exposure mask having an image pattern) were held in a vertical position. The distance between the surface of the exposure mask and the black coloring composition layer was set to 200 μm.

The thermoplastic resin layer and the interlayer were then removed by shower development at a flat nozzle pressure of 0.1 MPa with a triethanolamine developer (12 times dilution of the trade name T-PD2 (Fujifilm Corporation, triethanolamine content=30% by mass) with pure water (1 part of T-PD2 was mixed with 11 parts of pure water)) at 30° C. for 20 seconds. After air was blown onto the top surface of the COP film to remove any liquid, it was cleaned by showering with pure water for 10 seconds, followed by blowing air to reduce the liquid remaining on the substrate.

The coloring composition layer was then developed with a sodium carbonate/sodium hydrogen carbonate developer (5 times dilution of the trade name T-CD1 (Fujifilm Corporation) with pure water (1 part of T-CD1 was mixed with 4 parts of pure water)) at 30° C. and a shower pressure of 0.1 MPa for 30 seconds, followed by cleaning with pure water.

The coloring composition layer was then cleaned by showering with a surfactant-containing cleaning solution (10 times dilution of the trade name T-SD3 (Fujifilm Corporation) with pure water) at 33° C. and a conical nozzle pressure of 0.1 MPa for 20 seconds. Any residue was removed with ultrapure water ejected from an ultrahigh-pressure cleaning nozzle at a pressure of 9.8 MPa.

The pattern line width (W1) for a mask line width (W2) of 12.0 μm was determined using a fine-line-width determination device (CP-30, Soft Works Co., Ltd.). Sensitivity was evaluated on the following evaluation scale. Larger values are preferred. A, B, and C are acceptable for practical use. A and B are preferred, and A is more preferred.

A: 15 μm or more
B: 12 to less than 15 μm
C: 10 to less than 12 μm
D: 5 to less than 10 μm
E: less than 5 μm The results are summarized in Table 3 below.

Surface Electrical Resistance Evaluation

The protective film was removed from the transfer film of Example 1 fabricated as described above, and the bare surface of the black coloring composition layer was placed on a surface of an Eagle XG glass substrate (Corning Incorporated). The transfer film and the glass substrate were laminated together using a laminator (Hitachi Industries Co., Ltd. (Lamic II)) at a rubber roller temperature of 130° C., a linear pressure of 100 N/cm, and a transport speed of 2.2 m/min. The polyethylene terephthalate temporary support was then stripped and removed from the interface with the thermoplastic resin layer. After the stripping of the temporary support, the laminate was subjected to whole-image exposure at an exposure dose of 500 mJ/cm² using a proximity exposure system (Hitachi High-Tech Electronics Engineering Co., Ltd.) having an ultrahigh-pressure mercury lamp. The substrate and the mask (quartz exposure mask having an image pattern) were held in a vertical position. The distance between the surface of the exposure mask and the black coloring composition layer was set to 200 μm.

The thermoplastic resin layer and the interlayer were then removed by shower development at a flat nozzle pressure of 0.1 MPa with a triethanolamine developer (12 times dilution of the trade name T-PD2 (Fujifilm Corporation, triethanolamine content=30% by mass) with pure water (1 part of T-PD2 was mixed with 11 parts of pure water)) at 30° C. for 20 seconds. After air was blown onto the top surface of the bare wafer substrate to remove any liquid, it was cleaned by showering with pure water for 10 seconds, followed by blowing air to reduce the liquid remaining on the substrate. The substrate was then heated in an oven at 145° C. for 60 minutes to form a cured layer.

The resulting cured layer was tested for surface electrical resistance using a HIRESTA UX MCP-HT800 (Mitsubishi Chemical Analytech Co., Ltd.). The evaluation scale is given below. Larger values (Ω/sq) are preferred. A, B, and C are acceptable for practical use. A and B are preferred, and A is more preferred.

A: $1\times10^{13}$ or more
B: $1\times10^{12}$ to less than $1\times10^{13}$
C: $1\times10^{11}$ to less than $1\times10^{12}$
D: $1\times10^{10}$ to less than $1\times10^{11}$
E: less than $1\times10^{10}$ The results are summarized in Table 3 below Fabrication of Dry Film Resist for Overcoat Layer A method for fabricating a dry film resist for an overcoat layer will then be described. In a flask equipped with a stirrer, a reflux condenser, an inert gas inlet, and a thermometer were placed (1) propylene glycol monomethyl ether and toluene in the amounts shown below. The mixture was heated to 80° C. in a nitrogen gas atmosphere. A mixture of (2) ingredients in the amounts shown below was then uniformly added dropwise over 4 hours while the reaction temperature was maintained at 80° C.±2° C. After the addition of the mixture, stirring was continued for 6 hours while the liquid temperature was maintained at 80° C.±2° C. A solution (solid content=45% by mass) (A1) of a binder polymer having a weight average molecular weight of about 80,000 was obtained. The binder polymer had a weight average molecular weight of 65,000 and an acid value of 78 mg KOH/g.

(1)
Propylene glycol monomethyl ether 62 parts by mass
Toluene 62 parts by mass (2)
Methacrylic acid 12 parts by mass
Methyl methacrylate 58 parts by mass
Ethyl acrylate 30 parts by mass
2,2-Azobisisobutyronitrile 1.2 parts by mass The following ingredients were mixed with a magnetic stirrer for 30 minutes to prepare Resist Photosensitive Coating Solution A.

Binder Polymer Solution (A1) 133 parts by mass
IRGACURE OXE-01 (BASF, photopolymerization initiator) 5 parts by mass
KAYARAD PET-30 (Nippon Kayaku Co., Ltd., mixture of pentaerythritol triacrylate and pentaerythritol tetraacrylate) 40 parts by mass
2,2'-Methylene-bis(4-ethyl-6-tert-butylphenol) 0.1 part by mass
Octamethylcyclotetrasiloxane 0.1 part by mass
Methyl ethyl ketone 50 parts by mass Resist Photosensitive Coating Solution A prepared as described above was uniformly applied to a 50 μm thick polyethylene terephthalate film, serving as a temporary support, through a slit nozzle and was dried in a hot-air convection dryer at 100° C. for 3 minutes to remove any solvent and thereby form a photosensitive layer. A dry film resist for an overcoat layer was thus obtained. The resulting photosensitive layer had a thickness of 2.5 μm.

Fabrication of Film Sensor

Conductive films were prepared by forming an indium tin oxide transparent conductive layer (conductive layer for a first or second electrode pattern) having a thickness of 200 nm on one surface of a 200 μm thick colorless polyester film unwound from a roll, serving as a transparent substrate sheet, by sputtering and then forming a copper layer (conductive layer for a light-shielding conductive layer and wiring lines) having a thickness of 500 nm on the transparent conductive layer by sputtering.

Two (a pair of) conductive films were then laminated together with a transparent adhesive, with the surfaces of the polyester films facing each other, to obtain a laminate having conductive layers for a transparent conductive layer, a light-shielding conductive layer, and wiring lines on each side thereof.

A first photoresist layer having a thickness of 10 μm was then formed over each surface of the laminate using a dry film resist including an acrylic negative photosensitive layer capable of being developed with 1% sodium carbonate solution. A mask having an electrode pattern extending in the X direction was placed on one surface of the laminate, whereas a mask having an electrode pattern extending in the Y direction was placed on the other surface of the laminate. The laminate was simultaneously exposed on both sides with a metal halide lamp and was then developed by immersion in 1% sodium carbonate solution.

The indium tin oxide transparent conductive layer and the copper layer were then simultaneously removed from the region where no patterned first photoresist layer was present by etching with a ferric chloride etchant. As a result, a multilayer structure including a second electrode pattern extending in the X direction and a light-shielding conductive layer was formed on one surface of the transparent substrate sheet in the central window region such that the light-shielding conductive layer was bare, whereas a multilayer structure including a first electrode pattern extending in the Y direction and a light-shielding conductive layer was formed on the other surface of the transparent substrate sheet in the central window region such that the light-shielding conductive layer was bare. A multilayer structure including a first electrode pattern (or second electrode pattern), a light-shielding conductive layer, and a fine routing pattern, serving as wiring lines, connected to the electrode pattern and having an average line width of 20 μm was formed on each surface of the transparent substrate sheet in the outer frame region around the central window region such that the wiring lines were bare.

After the stripping of the first photoresist layer from each surface of the laminate, a second photoresist layer having a thickness of 10 μm was formed over each surface of the laminate using a dry film resist including an acrylic negative photosensitive layer capable of being developed with 1% sodium carbonate solution. A mask was placed on the surface of each second photoresist layer in the outer frame region excluding the terminal portion. The laminate was simultaneously exposed on both sides with a metal halide lamp and was then developed by immersion in 1% sodium carbonate solution.

The bare copper light-shielding conductive layer was then etched and removed from the central window region by immersion in aqueous hydrogen peroxide in an acidic condition to leave bare indium tin oxide first and second electrode patterns.

After the stripping of the second photoresist layer from each surface of the laminate, a third photoresist layer was formed over each surface of the laminate using the dry film resist for an overcoat layer. A mask was placed on the surface of each third photoresist layer in the outer frame region excluding the terminal portion. The laminate was simultaneously exposed on both sides with a metal halide lamp and was then developed by immersion in 1% sodium carbonate solution to form overcoat layers over the electrode patterns.

As a fourth photoresist layer, the coloring composition layer having a thickness of 2 μm was transferred from the transfer film of Example 1 to one surface of the laminate (on which the second electrode pattern was formed) in its entirety, including at least a region of the wiring lines and at least a region of the overcoat layer. A mask was placed on the fourth photoresist layer. The laminate was exposed with a metal halide lamp and was then developed by immersion in 1% sodium carbonate solution.

The fourth photoresist layer was then cured by heating in an oven at 145° C. for 30 minutes.

The black fourth photoresist layer remained as a frame-shaped decorative layer.

One film sensor was then cut to obtain a film sensor of Example 1.

The film sensor of Example 1 had the structure shown in the schematic view in FIG. 11A excluding the transparent layers 11. The light-shielding conductive layer 9 was formed in part by the same member as the wiring lines 6.

Transferability Evaluation

Figure 12:
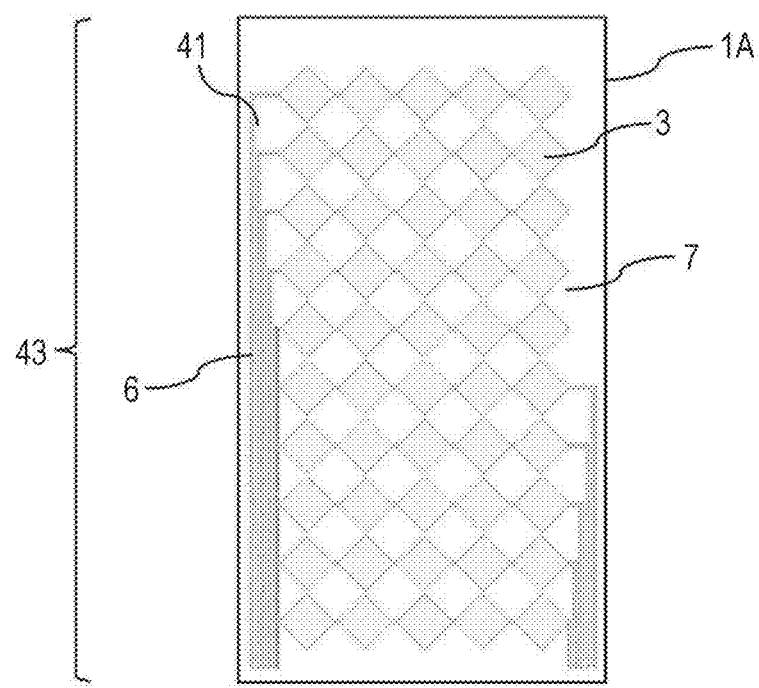
FIG. 12 is an illustration used to describe a region extending along an overcoat layer at the boundary between wiring lines and the overcoat layer in an example method for manufacturing a film sensor according to the present invention.

The region extending along the decorative layer at the boundary between the wiring lines and overcoat layer and the decorative layer was examined under a light microscope to count the number of bubbles that entered this region during the formation of the decorative layer by transfer. Transferability was evaluated on the following scale. FIG. 12 shows a schematic view of the region extending along the overcoat layer 7 at the boundary between the wiring lines 6 and overcoat layer 7 and the decorative layer.

In the transferability evaluation, fewer bubbles are preferred. A, B, and C are acceptable for practical use. A and B are preferred, and A is more preferred.

A: fewer than 5 bubbles
B: 5 to fewer than 30 bubbles
C: 30 to fewer than 50 bubbles
D: 50 to fewer than 100 bubbles
E: 100 or more bubbles The results are summarized in Table 3 below.

Edge Roughness Evaluation

The area inside the frame-shaped decorative layer of the film sensor of Example 1 was examined under a laser microscope (VK-9500, Keyence Corporation; 50× objective lens) to determine the absolute difference in edge position between the most expanded portion (peak) and the most retracted portion (trough) in a field of view. Edge roughness was calculated as the average of the absolute differences obtained by examining five fields of view. A lower edge roughness is preferred since it results in sharper contours of a display screen of a cover glass and sensor assembly. A, B, and C are acceptable for practical use. A and B are preferred, and A is more preferred.

A: less than 1 μm
B: 1 to less than 2 μm
C: 2 to less than 4 μm
D: 4 to less than 7 μm
E: 7 μm or more The results are summarized in Table 3 below.

Fabrication of Sensor Integrated with Front Panel

A 0.7 mm thick borosilicate glass substrate was used as a transparent front panel. A second decorative layer having a thickness of 7 μm was formed on the peripheral portion of the surface of the transparent front panel to which a film sensor was to be bonded by screen printing with a black ink to obtain a cover glass.

The film sensor of Example 1 was bonded with a transparent adhesive to the surface of the cover glass on which the second decorative layer was formed to obtain a sensor integrated with front panel (hereinafter also referred to as "cover glass and sensor assembly") of Example 1 in which the second decorative layer was disposed between the transparent front panel and the decorative layer of the film sensor.

The inner edges of the decorative layer of the film sensor in the cover glass and sensor assembly of Example 1 were located closer to the center than the inner edges of the second decorative layer of the transparent front panel by a distance of 0.1 mm. The orthogonal projection of the second decorative layer overlapped at least a region of the decorative layer of the film sensor as viewed in a direction normal to the transparent front panel. The distance between the surface of the glass substrate, serving as a transparent front panel, to which the film sensor was bonded and the decorative layer of the film sensor was 25 μm.

The sensor integrated with front panel of Example 1 had the structure shown in the schematic view in FIG. 1 excluding the transparent layers 11. The light-shielding conductive layer 9 was formed in part by the same member as the wiring lines 6.

Examples 2 to 11 and 13 to 18 and Comparative Examples 1 to 3

Transfer films of the Examples and Comparative Examples were fabricated and evaluated as in Example 1 except that, in the manufacture of the transfer film of Example 1, Black Composition K1, serving as a coloring composition for forming a coloring composition layer, was replaced with the coloring compositions shown in Tables 1 and 2, and the thickness of the coloring composition layer was changed as in Tables 1 and 2.

Film sensors and cover glass and sensor assemblies of the Examples and Comparative Examples were then fabricated and evaluated as in Example 1 except that, in the manufacture of the film sensor and the cover glass and sensor assembly of Example 1, the transfer film of Example 1 was replaced with the transfer films of the Examples and Comparative Examples.

K Pigment Dispersion 2 and R Pigment Dispersion 3 in Tables 1 and 2 were prepared by mixing a pigment, a dispersing agent, a polymer, and a solvent using a three-roll mill and a bead mill so that the mixtures had the following compositions. Nipex 35 from Degussa GmbH below is a carbon black not coated with a resin.

K Pigment Dispersion 2

Carbon black (Degussa GmbH, Nipex 35): 13.1% by mass

Dispersing Agent 1 above: 0.65% by mass

Polymer (random copolymer with molar ratio of benzyl methacrate/methacrylic acid of 72/28, weight average molecular weight=37,000): 6.72% by mass Propylene glycol monomethyl ether acetate: 79.53% by mass R Pigment Dispersion 3

C.I. Pigment Red 177 (PR177, primary particle size=15 to 60 nm): 10 parts by mass Dispersing agent (BYK2000, Byk-Chemie GmbH, solid content=40% by mass): 10 parts by mass Styrene/benzyl methacrylate/acrylic acid/2-hydroxymethyl acrylate copolymer (molar ratio=30/40/10/20, acid value=70 mg KOH/g, molecular weight=6,000): 4 parts by mass Propylene glycol monomethyl ether acetate: 76 parts by mass Example 12

A transfer film of Example 12 was fabricated and evaluated as in Example 1 except that, in the manufacture of the transfer film of Example 1, Black Composition K1, serving as a coloring composition for forming a coloring composition layer, was replaced with the coloring composition shown in Table 2.

A film sensor of Example 12 was then fabricated and evaluated as in Example 1 except that, in the manufacture of the film sensor of Example 1, the transfer film of Example 1 was replaced with the transfer film of Example 12.

A second decorative layer having a thickness of 7 μm was formed on the peripheral portion of the noncontact surface of a 0.2 mm thick PET transparent front panel by screen printing with a black ink to obtain a front panel. Finally, the fourth photoresist layer of the film sensor of Example 12 and the second decorative layer of the front panel were bonded together with a transparent adhesive to obtain a sensor integrated with front panel. The inner edges of the decorative layer of the film sensor in the sensor integrated with front panel of Example 12 were located closer to the center than the inner edges of the second decorative layer of the transparent front panel by a distance of 0.1 mm. The orthogonal projection of the second decorative layer overlapped at least a region of the decorative layer of the film sensor as viewed in a direction normal to the transparent front panel. The distance between the back surface of the glass substrate, serving as a transparent front panel, and the decorative layer of the film sensor was 25 μm.

TABLE 1

| | Coloring composition | Ex. 1 | Ex. 2 | Ex. 3 | Ex. 4 | Ex. 5 | Ex. 6 | Ex. 7 | Ex. 8 | Ex. 9 | Ex. 10 |
|---|---|---|---|---|---|---|---|---|---|---|---|
| Black or white pigment | K Pigment Dispersion 1 | 137.4 | 119.5 | 137.4 | 137.4 | 137.4 | 137.4 | 137.4 | 119.5 | 119.5 | 87.8 |
| | K Pigment Dispersion 2 | | | | | | | | | | |
| Other particles | R Pigment Dispersion 1 | | 15.6 | | | | | | 15.6 | 15.6 | |
| Polymerizable compound | Dipentaerythritol (penta/hexa)acrylate (KAYARAD DPHA, Nippon Kayaku Co., Ltd.) | 19.5 | 10.5 | 19.5 | 9.0 | 7.0 | 7.0 | 7.0 | 19.5 | 13.0 | 19.5 |
| | Ethoxylated Bisphenol A diacrylate (A-BPE-10, Shin Nakamura Chemical Co., Ltd.) | | | 6.5 | | 7.0 | | | 6.5 | | |
| | Monomer mixture (polymerizable compound disclosed in paragraph [0111] of Japanese Unexamined Patent Application Publication No. 2012-78528 (b2-1, tripentaerythritol octaacrylate (n = 1) content: 85%, total impurity (n = 2 and n = 3) content: 15%)) | | | | 10.5 | | 7.0 | 3.0 | | 13.0 | |
| | Urethane monomer (UK Oligo UA-32P, Shin Nakamura Chemical Co., Ltd., nonvolatile content: 75%, 1-methoxy-2-propyl acetate content: 25% | | 9.0 | | | | | | | | |
| | Tricyclodecane dimethanol diacrylate (A-DCP, Shin Nakamura Chemical Co., Ltd.) | 6.5 | 6.5 | | 6.5 | 12.0 | 12.0 | 16.0 | | | 6.5 |
| Binder | 1-Methoxy-2-propanol and methyl ethyl ketone solution (solid content: 45%) of adduct of cyclohexyl methacrylate (a)/methyl methacrylate (b)/methacrylic acid (c) copolymer with glycidyl methacrylate (d) (composition (mass %): a/b/c/d = 46/1/10/43, weight average molecular weight: 36,000, acid value: 66 mg KOH/g) | 81.2 | 97.8 | 89.7 | 89.7 | 89.7 | 87.7 | 87.7 | 97.8 | 89.4 | 93.6 |
| Initiator | 1,2-Octanedione-[4-(phenylthio)-2-(O-benzoyloxime)] (IRGACURE OXE-01, BASF) | 9.2 | | | | | | | | 9.2 | |
| | Ethan-1-one, 1-[9-ethyl-6-(2-methylbenzoyl)-9H-carbazol-3-yl]-1-(O-acetyloxime) (IRGACURE OXE-02, BASF) | | 3.2 | 3.2 | 3.2 | 3.2 | 3.2 | 3.2 | 3.2 | | |
| | DFI-020 (Daito Chemix Corporation) | | | | | | | | | | |
| | 2,4-Bis(trichloromethyl)-6-[4'-(N,N-bis(ethoxycarbonylmethyl)amino-3'-bromophenyl]-s-triazine | | | | | | | | | | |
| | 2-methyl-1-[4-(methylthio)phenyl]-2-morpholinopropan-1-one (IRGACURE 907, BASF) | | | | | | | | | | 8.2 |
| | 2,4-Diethylthioxanthone (KAYACURE DETX-S, Nippon Kayaku Co., Ltd.) | | | | | | | | | | 5.6 |
| Thiol | 1,4-Bis(3-mercaptobutyryloxy)butane (KARENZ MT BD1, Showa Denko K.K.) | | 2.2 | | | | | | 2.2 | | |
| | 1,3,5-Tris(3-mercaptobutyryloxyethyl)-1,3,5-triazine-2,4,6-(1H,3H,5H)-trione (KARENZ MT NR1, Showa Denko K.K.) | | | | | 2.2 | | | | | |
| | Pentaerythritol tetrakis(3-mercaptobutyrate) (KARENZ MT PE1, Showa Denko K.K.) | | | | | | 2.2 | | | | |
| | Pentaerythritol tetrakis(3-mercaptopropionate) (PEMP, Sakai Chemical Industry Co., Ltd.) | | | 2.2 | | | | | | | |
| | N-Phenylmercaptobenzimidazole | | | | | | | | 3.1 | 3.1 | |
| Metal oxidation inhibitor | Benzotriazole | | | | | | | | | | |
| Polymerization inhibitor | Phenothiazine | 0.3 | 0.3 | 0.3 | 0.3 | 0.3 | 0.3 | 0.3 | 0.3 | 0.3 | 0.3 |

TABLE 1-continued

| Coloring composition | | Ex. 1 | Ex. 2 | Ex. 3 | Ex. 4 | Ex. 5 | Ex. 6 | Ex. 7 | Ex. 8 | Ex. 9 | Ex. 10 |
|---|---|---|---|---|---|---|---|---|---|---|---|
| Surfactant | Structure 1 below | 0.4 | 0.4 | 0.4 | 0.4 | 0.4 | 0.4 | 0.4 | 0.4 | 0.4 | 0.4 |
| Solvent | 1-Methoxy-2-propyl acetate | 238.7 | 229.7 | 234.1 | 234.1 | 234.1 | 235.2 | 235.2 | 232.0 | 236.6 | 271.4 |
| | Methyl ethyl ketone | 321.3 | 321.3 | 321.3 | 321.3 | 321.3 | 321.3 | 321.3 | 321.3 | 321.3 | 321.3 |
| | Black or white pigment content (wt % based on solid content excluding solvents, (a)) | 18.0 | 15.7 | 18.0 | 18.0 | 18.0 | 18.0 | 18.0 | 15.7 | 15.7 | 11.5 |
| Transfer film | Coating thickness (μm, (b)) | 2.0 | 2.0 | 2.0 | 2.0 | 2.0 | 2.0 | 2.0 | 2.0 | 2.0 | 1.3 |
| | (a) × (b) | 36.0 | 31.3 | 36.0 | 36.0 | 36.0 | 36.0 | 36.0 | 31.3 | 31.3 | 15.0 |

TABLE 2

| | Coloring composition | Ex. 11 | Ex. 12 | Ex. 13 | Ex. 14 | Ex. 15 | Ex. 16 | Ex. 17 | Ex. 18 | Com. Ex.1 | Com. Ex.2 | Com. Ex.3 |
|---|---|---|---|---|---|---|---|---|---|---|---|---|
| Black or white pigment | K Pigment Dispersion 1 | 87.8 | | 137.4 | 137.4 | 119.5 | 25.2 | 137.4 | 137.4 | 72.5 | 72.5 | 206.1 |
| | K Pigment Dispersion 2 | | 120.0 | | | | | | | | | |
| Other particles | R Pigment Dispersion 1 | | | | | | 15.6 | | | | | |
| Polymerizable compound | Dipentaerythritol (penta/hexa)acrylate (KAYARAD DPHA, Nippon Kayaku Co., Ltd.) | 19.5 | 19.5 | | 19.5 | 10.5 | 15.0 | 7.0 | 9.0 | 19.5 | 19.5 | 19.5 |
| | Ethoxylated Bisphenol A diacrylate (A-BPE-10, Shin Nakamura Chemical Co., Ltd.) | | | 19.5 | | | | | | | | |
| | Monomer mixture (polymerizable compound disclosed in paragraph [0111] of Japanese Unexamined Patent Application Publication No. 2012-78528 (b2-1, tripentaerythritol octaacrylate (n = 1) content: 85%, total impurity (n = 2 and n = 3) content: 15%)) | | | | | | | 3.0 | 10.5 | | | |
| | Urethane monomer (UK Oligo UA-32P, Shin Nakamura Chemical Co., Ltd., nonvolatile content: 75%, 1-methoxy-2-propyl acetate content: 25% | | | | | 9.0 | 13.5 | | | | | |
| | Tricyclodecane dimethanol diacrylate (A-DCP, Shin Nakamura Chemical Co., Ltd.) | 6.5 | 6.5 | 6.5 | 6.5 | 6.5 | 8.5 | 16.0 | 6.5 | 6.5 | 6.5 | 6.5 |
| Binder | 1-Methoxy-2-propanol and methyl ethyl ketone solution (solid content: 45%) of adduct of cyclohexyl methacrylate (a)/methyl methacrylate (b)/methacrylic acid (c) copolymer with glycidyl methacrylate (d) (composition (mass %): a/b/c/d = 46/1/10/43, weight average molecular weight: 36,000, acid value: 66 mg KOH/g) | 112.2 | 152.2 | 89.7 | 81.2 | 97.8 | 116.3 | 87.7 | 89.7 | 113.0 | 119.2 | 50.0 |
| Initiator | 1,2-Octanedione-[4-(phenylthio)-2-(O-benzoyloxime)] (IRGACURE OXE-01, BASF) | | | | | | | | | | | 9.2 |
| | Ethan-1-one, 1-[9-ethyl-6-(2-methylbenzoyl)-9H-carbazol-3-yl]-1-(O-acetyloxime) (IRGACURE OXE-02, BASF) | 3.2 | 3.2 | 3.2 | | 3.2 | 3.2 | 3.2 | | | 3.2 | |
| | DFI-020 (Daito Chemix Corporation) | | | | | | | | 3.2 | | | |
| | 2,4-Bis(trichloromethyl)-6-[4'-(N,N bis(ethoxy-carbonylmethyl)amino-3'-bromophenyl)-s-triazine | | | | 9.2 | | | | | | | |
| | 2-methyl-1-[4-(methylthio)phenyl]-2-morpholino-propan-1-one (IRGACURE 907, BASF) | | | | | | | | | 4.5 | | |
| | 2,4-Diethylthioxanthone (KAYACURE DETX-S, Nippon Kayaku Co., Ltd.) | | | | | | | | | 3.7 | | |
| Thiol | 1,4-Bis(3-mercaptobutyryloxy)butane (KARENZ MT BD1, Showa Denko K.K.) | 2.2 | 2.2 | 2.2 | | 2.2 | 2.2 | | | | 2.2 | |
| | 1,3,5-Tris(3-mercaptobutyryloxyethyl)-1,3,5-triazine-2,4,6-(1H,3H,5H)-trione (KARENZ MT NR1, Showa Denko K.K.) | | | | | | | | 2.2 | | | |
| | Pentaerythritol tetrakis(3-mercaptobutyrate) (KARENZ MT PE1, Showa Denko K.K.) | | | | | | | | | | | |
| | Pentaerythritol tetrakis(3-mercaptopropionate) (PEMP, Sakai Chemical Industry Co., Ltd.) | | | | | | | | | | | |
| | N-Phenylmercaptobenzimidazole | | | | | | | | | | | |
| Metal oxidation inhibitor | Benzotriazole | | | | | | | | 3.1 | | | |
| Polymerization inhibitor | Phenothiazine | 0.3 | 0.3 | 0.3 | 0.3 | 0.3 | 0.3 | 0.3 | 0.3 | 0.3 | 0.3 | 0.3 |

TABLE 2-continued

| | Coloring composition | Ex. 11 | Ex. 12 | Ex. 13 | Ex. 14 | Ex. 15 | Ex. 16 | Ex. 17 | Ex. 18 | Com. Ex.1 | Com. Ex.2 | Com. Ex.3 |
|---|---|---|---|---|---|---|---|---|---|---|---|---|
| Surfactant | Structure 1 below | 0.4 | 0.4 | 0.4 | 0.4 | 0.4 | 0.4 | 0.4 | 0.4 | 0.4 | 0.4 | 0.4 |
| Solvent | 1-Methoxy-2-propyl acetate | 261.1 | 213.6 | 234.1 | 238.7 | 229.7 | 305.3 | 235.2 | 234.1 | 272.9 | 269.5 | 201.3 |
| | Methyl ethyl ketone | 321.3 | 321.3 | 321.3 | 321.3 | 321.3 | 321.3 | 321.3 | 321.3 | 321.3 | 321.3 | 321.3 |
| | Black or white pigment content (mass % based on solid content excluding solvents, (a)) | 11.5 | 18.0 | 18.0 | 18.0 | 15.7 | 3.3 | 18.0 | 18.0 | 9.5 | 9.5 | 27.0 |
| Transfer film | Coating thickness (μm, (b)) | 1.3 | 2.0 | 2.0 | 2.0 | 2.0 | 9.8 | 2.0 | 2.0 | 1.0 | 1.0 | 2.0 |
| | (a) × (b) | 15.0 | 36.0 | 36.0 | 36.0 | 31.3 | 32.3 | 36.0 | 36.0 | 9.5 | 9.5 | 54.0 |

Structure 1

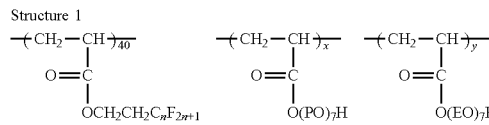

($n = 6$, $x = 55$, $y = 5$, Mw = 33,940, Mw/Mn = 2.55, PO: propylene oxide, EO: ethylene oxide)

TABLE 3

| | | Structure | | | | | | | | | | | |
|---|---|---|---|---|---|---|---|---|---|---|---|---|---|
| | Transfer film | Ex. 1 | Ex. 2 | Ex. 3 | Ex. 4 | Ex. 5 | Ex. 6 | Ex. 7 | Ex. 8 | Ex. 9 | Ex. 10 | Ex. 11 | Ex. 12 |
| | Front panel | Glass | Glass | Glass | Glass | Glass | Glass | Glass | Glass | Glass | Glass | Glass | Glass |
| Evaluation of transfer film | Optical density | A | B | A | A | A | A | A | B | B | C | C | A |
| | Sensitivity | C | A | A | A | A | C | C | B | C | C | A | A |
| | Surface electrical resistance | A | A | A | A | A | A | A | A | A | A | A | C |
| Evaluation of sensor integrated with front panel | Transferability | B | A | B | B | B | B | B | A | A | B | B | B |
| | Edge roughness | A | A | C | B | B | A | A | A | B | A | A | A |

| | | Structure | | | | | | | | |
|---|---|---|---|---|---|---|---|---|---|---|
| | Transfer film | Ex. 13 | Ex. 14 | Ex. 15 | Ex. 16 | Ex. 17 | Ex. 18 | Com. Ex. 1 | Com. Ex. 2 | Com. Ex. 3 |
| | Front panel | Glass | Glass | PET | Glass | Glass | Glass | Glass | Glass | Glass |
| Evaluation of transfer film | Optical density | A | A | B | A | A | A | E | E | A |
| | Sensitivity | C | C | B | A | C | A | C | A | E |
| | Surface electrical resistance | A | A | A | A | A | A | A | A | A |
| Evaluation of sensor integrated with front panel | Transferability | B | B | A | B | B | B | B | B | B |
| | Edge roughness | B | B | A | A | B | B | E | A | E |

The transfer films of the Examples, serving as transfer films for forming a decorative layer on at least one surface of a film sensor, had high optical density and high sensitivity.

In addition, the sensors integrated with front panel of Examples 1 to 11 and 13 to 18, when incorporated into image display devices, had a display screen (display unit) with sharp contours, good visibility, and high visual integrity at the edges of the display unit as viewed through the cover glass, serving as a transparent front panel. The sensor integrated with front panel of Example 12 had a display screen with sharp contours, good visibility, and high visual integrity with the portion around the display screen as viewed through the PET film, serving as a transparent front panel.

In contrast, the transfer films of Comparative Examples 1 and 2, in which a×b fell below the lower limit of inequality 1, had low optical density. In addition, the sensors integrated with front panel of Comparative Examples 1 and 2 had low visual integrity since the edges of the display unit were visible.

The transfer film of Comparative Example 3, which was intended to investigate the use of a color resist material containing a high concentration of a black or white pigment as a coloring composition for forming a decorative layer of a film sensor (method disclosed in Japanese Unexamined Patent Application Publication No. 2012-133597), had low sensitivity since a×b exceeded the upper limit of inequality 1. In addition, the edges of the display unit of the film sensor and the sensor integrated with front panel of Comparative Example 3 were not clean and had a poor appearance since the coloring composition layer was insufficiently cured by photopolymerization and thus exhibited high edge roughness after the development step. The yield was also significantly low since the decorative layer was vulnerable due to insufficient curing at low baking temperature.

Fabrication of Image Display Device (Touch Panel)

The sensor integrated with front panel of each Example manufactured as described above was bonded to a liquid crystal display element manufactured as disclosed in Japanese Unexamined Patent Application Publication No. 2009-47936, and an image display device of each Example including, the sensor integrated with front panel of the same example, serving as a capacitive input device, was fabricated by a known method.

The image display devices of the Examples had a display screen with sharp contours, good visibility, and high visual integrity with the portion around the display screen as viewed through the front panel.

REFERENCE SIGNS LIST 1 transparent substrate (front panel)
1A substrate sheet
2 second decorative layer (mask layer)
3 electrode pattern (first electrode pattern)
3a pad
3b connection
4 electrode pattern (second electrode pattern)
5 insulating layer
6 routing line (different conductive element)
7 overcoat layer
8 opening
9 light-shielding conductive layer
10 sensor integrated with front panel
11 transparent layer (high-refractive-index layer)
α taper angle
41 region extending along overcoat layer at boundary between wiring lines and overcoat layer
43 film sensor
45 decorative layer (decorative layer of film sensor)
46 temporary support
47 protective release layer (protective film)
48 coloring composition layer
49 transfer film
51 adhesive
C first direction
D second direction

What is claimed is:

1. A transfer film for forming a decorative layer on at least one surface of a film sensor, the transfer film comprising a coloring composition layer containing a black or white pigment, the coloring composition layer satisfying the relationship $$50 > a \times b > 10 \quad \text{inequality 1}$$

wherein a is the mass content ratio of the black or white pigment in the coloring composition layer, and b is the thickness of the coloring composition layer having a unit of μm.

2. The transfer film according to claim 1, wherein the black or white pigment comprises carbon black or titanium oxide particles.

3. The transfer film according to claim 2, wherein the carbon black is a resin-coated carbon black.

4. The transfer film according to claim 1, wherein the coloring composition layer has a thickness of 0.5 to 10 μm.

5. The transfer film according to claim 1, wherein the coloring composition layer contains an oxime polymerization initiator.

6. The transfer film according to claim 1, wherein the coloring composition layer contains a thiol compound.

7. The transfer film according to claim 6, wherein the thiol compound has two or more thiol groups.

8. The transfer film according to claim 1, wherein the coloring composition layer contains a binder having a carboxyl group, and
the binder has an acid value of 50 mg KOH/g or more.

9. The transfer film according to claim 1, wherein the coloring composition layer contains a polymerizable compound having at least five ethylenically unsaturated groups.

10. The transfer film according to claim 1, wherein the coloring composition layer has a halogen-containing compound content of 1% by mass or less.

11. The transfer film according to claim 1, further containing particles other than the black or white pigment.

12. A method for manufacturing a film sensor, comprising:
transferring the coloring composition layer from the transfer film according to claim 1 to at least one surface of a film sensor to form a decorative layer,
the film sensor comprising:
a transparent substrate sheet;
an electrode pattern disposed on each side of the substrate sheet;
wiring lines connected to the electrode pattern; and
an overcoat layer disposed over the electrode pattern.

13. The method for manufacturing a film sensor according to claim 12, further comprising heating the film sensor at 130° C. to 170° C. after transferring the coloring composition layer.

14. The method for manufacturing a film sensor according to claim 12, wherein the at least one surface of the film sensor to which the coloring composition layer is transferred includes at least a region of the wiring lines and at least a region of the overcoat layer.

15. A film sensor comprising:
a transparent substrate sheet;
an electrode pattern disposed on each side of the substrate sheet;
wiring lines connected to the electrode pattern; and
an overcoat layer disposed over the electrode pattern,
wherein a decorative layer is disposed on at least one surface of the film sensor, and
the film sensor is manufactured by the method for manufacturing a film sensor according to claim 12.

16. A sensor integrated with front panel comprising:
a transparent front panel; and
the film sensor according to claim 15.

17. The sensor integrated with front panel according to claim 16, further comprising a second decorative layer in a region of one surface of the front panel,
wherein the second decorative layer is disposed between the front panel and the decorative layer of the film sensor, and
an orthogonal projection of the second decorative layer overlaps at least a region of the decorative layer of the film sensor as viewed in a direction normal to the front panel.

18. The sensor integrated with front panel according to claim 16, wherein the front panel is formed of a glass.

19. An image display device comprising, the sensor integrated with front panel according to claim 18.

* * * * *